(12) United States Patent
Wang et al.

(10) Patent No.: US 9,613,676 B1
(45) Date of Patent: Apr. 4, 2017

(54) WRITING TO CROSS-POINT NON-VOLATILE MEMORY

(71) Applicant: Micron Technology, Inc., Boise, ID (US)

(72) Inventors: Bei Wang, Boise, ID (US); Alessandro Calderoni, Boise, ID (US); Wayne Kinney, Emmett, ID (US); Adam Johnson, Meridian, ID (US); Durai Vishak Nirmal Ramaswamy, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/197,416

(22) Filed: Jun. 29, 2016

(51) Int. Cl.
*G11C 11/22* (2006.01)
*G11C 11/56* (2006.01)
*H01L 27/11507* (2017.01)
*G11C 14/00* (2006.01)
*H01L 27/11502* (2017.01)

(52) U.S. Cl.
CPC .......... *G11C 11/2275* (2013.01); *G11C 11/22* (2013.01); *G11C 11/221* (2013.01); *G11C 11/2253* (2013.01); *G11C 11/2273* (2013.01); *G11C 11/5657* (2013.01); *G11C 14/00* (2013.01); *H01L 27/11507* (2013.01); *H01L 27/11502* (2013.01)

(58) Field of Classification Search
CPC ..... G11C 11/22; G11C 11/5657; G11C 14/00; H01L 27/11507; H01L 27/11502
USPC ........................................................ 365/145
See application file for complete search history.

(56) References Cited

U.S. PATENT DOCUMENTS

| | | | | |
|---|---|---|---|---|
| 6,924,663 | B2 * | 8/2005 | Masui ...................... | G06F 21/76 326/38 |
| 7,042,754 | B2 * | 5/2006 | Mukaiyama ............ | G11C 11/22 365/145 |
| 7,133,304 | B2 * | 11/2006 | Madan .................... | G11C 11/22 365/145 |
| 7,224,597 | B2 * | 5/2007 | Koide ..................... | G11C 29/84 365/145 |
| 7,768,811 | B2 * | 8/2010 | Matsuno ................. | G11C 11/22 365/145 |

OTHER PUBLICATIONS

Sakai et al., "A novel access scheme suppressing disturbance for a cross-point type ferroelectric memory," VLSI Circuits, 2003 Digest of Technical Papers, Jun. 12-14, 2003, pp. 171-172, IEEE.

* cited by examiner

*Primary Examiner* — Pho M Luu
(74) *Attorney, Agent, or Firm* — Holland & Hart LLP

(57) ABSTRACT

Methods, systems, and devices for preventing disturb of untargeted memory cells during repeated access operations of target memory cells are described for a non-volatile memory array. Multiple memory cells may be in electronic communication with a common conductive line, and each memory cell may have an electrically non-linear selection component. Following an access operation (e.g., a read or write operation) of a target memory cell, untargeted memory cells may be discharged by applying a discharge voltage to the common conductive line. The discharge voltage may, for example, have a polarity opposite to the access voltage. In other examples, a delay may be instituted between access attempts in order to discharge the untargeted memory cells.

35 Claims, 16 Drawing Sheets

WRITING TO CROSS-POINT NON-VOLATILE MEMORY

BACKGROUND

The following relates generally to memory devices and more specifically to operating non-volatile memory arrays.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

In some memory architectures, multiple memory cells may be in electronic communication with a common conductive line. Reading or writing one of the memory cells may affect the other, untargeted memory cells. For example, repeatedly energizing the common conductive line to read or write one of the memory cells may disturb or corrupt the stored logic values in the untargeted memory cells. This may reduce the performance or even jeopardize the operation of the memory array.

BRIEF DESCRIPTION OF THE DRAWINGS

The disclosure herein refers to and includes the following figures.

DETAILED DESCRIPTION

Figure 1:
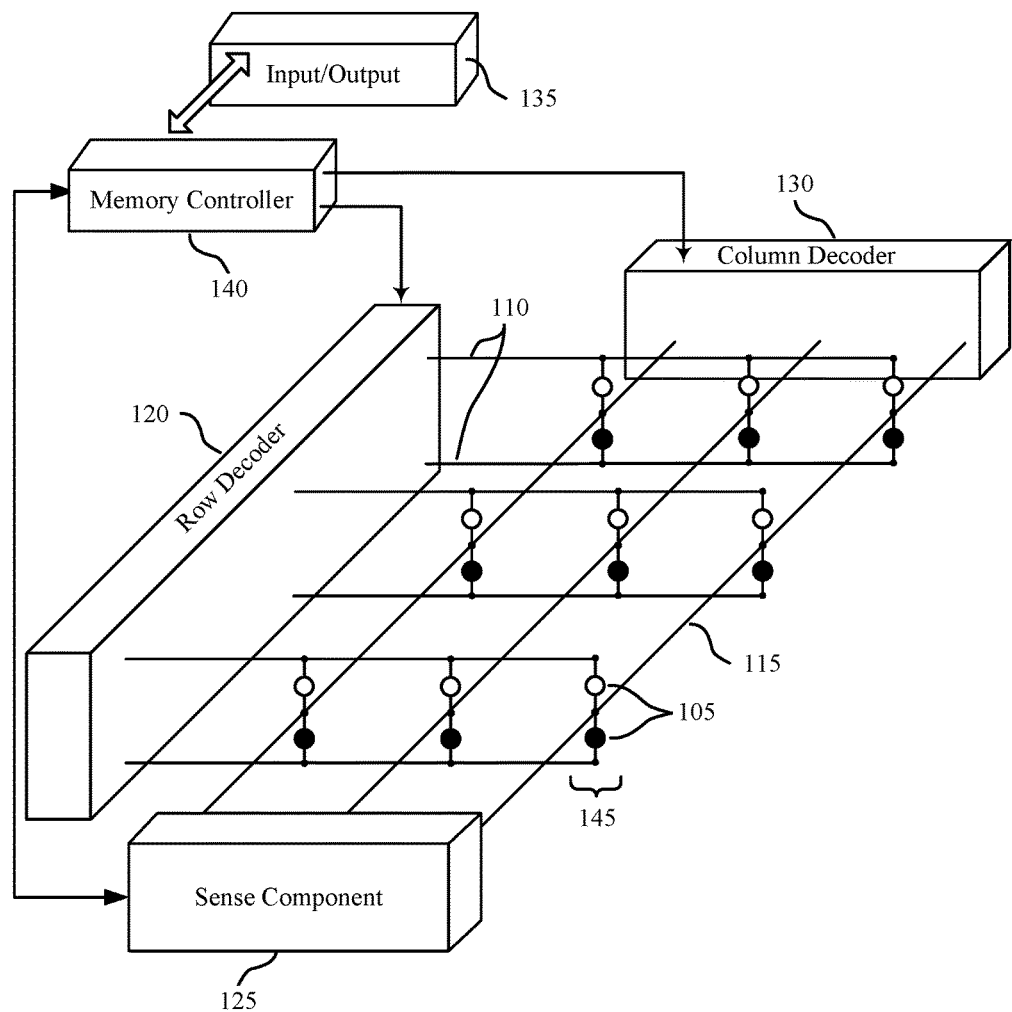
FIG. 1 illustrates an example memory array that supports discharging untargeted memory cells in accordance with various embodiments of the present disclosure.

Following an access operation (e.g., read or write operation) of a memory cell, untargeted memory cells may be discharged before a subsequent access operation. Multiple memory cells may be in electronic communication with a common conductive line. The conductive line may be energized (e.g., applying a voltage) in order to perform an access operation of a target memory cell; however, other, untargeted memory cells connected to the conductive line may experience charge build up in response. If the conductive line is repeatedly energized, the charge build-up may increase to a point that it disturbs or corrupts the stored logic values of the untargeted memory cells. That is, in some cases, the charge build-up results in a sufficiently large voltage to modify the stored state of untargeted memory cells. To compensate for this effect, the untargeted memory cells may be discharged using a number of techniques, including delaying a subsequent access attempt or by applying to the conductive line a discharge voltage with a polarity opposite the access voltage.

By way of example, some memory architectures may have multiple memory cells connected to a common conductive line. A memory cell may exist at the intersection of two such common conductive lines, and each memory cell may be accessed by activating its two respective conductive lines. Such a memory array may be referred to as a cross-point array or a cross-point architecture. The memory cells may include a two-terminal selection component, where the selection component may be integrated with the memory cell between the two conductive lines.

In these types of architectures, repeatedly accessing the same conductive line may disturb one or more memory cells in electronic communication with that conductive line. A memory cell may be accessed when both its conductive lines are energized. Such a memory cell may be a target memory cell. However, applying a voltage to a conductive line may affect the other cells commonly connected to that conductive line, i.e., the untargeted cells of the access operation. For example, charge may build up within the untargeted memory cell, creating a non-zero voltage. Over time, the untargeted memory cell may discharge, however, repeated access attempts of the target memory cell may increase the charge. This charging may produce a voltage within the memory cell, which may be sufficient to disturb (i.e., alter) the stored logic state of the untargeted memory cell.

As disclosed herein, methods to prevent disturbing untargeted memory cells due to repeated energizing of a common conductive line are presented. The memory cells may each be in electronic communication with a selection component, which may suppress the bias across untargeted memory cells. Following an access operation, a subsequent voltage pulse, referred to herein as a discharge voltage, may be applied to one or both conductive lines used during the access operation. The discharge voltage may have a polarity opposite the polarity applied to the respective conductive line during the access operation. Such a discharge voltage may reduce the charge stored within the untargeted memory cell, which may enable repeated access attempts while preventing memory cell disturb. Because such a technique coupled with a selection component prevents cell disturb, it may obviate a need for refresh or write-back operations of the untargeted memory cells.

In another embodiment, a delay may be instituted between access attempts in order to discharge the untargeted cells. For example, subsequent access operations may be barred (i.e., may not be allowed) until a timer expires. In some cases, the timer may be overridden, and a discharge voltage may be applied following the access operation.

Features and techniques introduced above are further described below in the context of a memory array. Specific examples are then described for discharging untargeted memory cells after accessing a target memory cell. These and other features of the disclosure are further illustrated by and described with reference to apparatus diagrams, system diagrams, and flowcharts that relate to reading or writing non-volatile memory cells.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or paraelectric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be substantially perpendicular to one another to create an array. As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing a target memory cell 105 may affect untargeted memory cells 105. For example, a non-zero voltage may develop across one or more electrodes of the untargeted memory cell 105. By repeatedly energizing the same word line 110 or bit line 115, the effect may compound such that it may corrupt the stored logic values of the untargeted memory cells 105. Methods disclosed herein may prevent such corruption of untargeted memory cells 105. For example, a discharge pulse may be applied to the word line 110 or bit line 115 after an access operation, where the discharge voltage has a polarity opposite the polarity of the access voltage. In other cases, a delay may be instituted before a subsequent access operation to allow the untargeted memory cell 105 to discharge from the previous access operation.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as input/output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. Reading or writing a target memory cell 105 may, however, corrupt the logic states of untargeted memory cells 105. This process is discussed in more detail below.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. For example, it may apply discharge voltages to a word line 110 or bit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
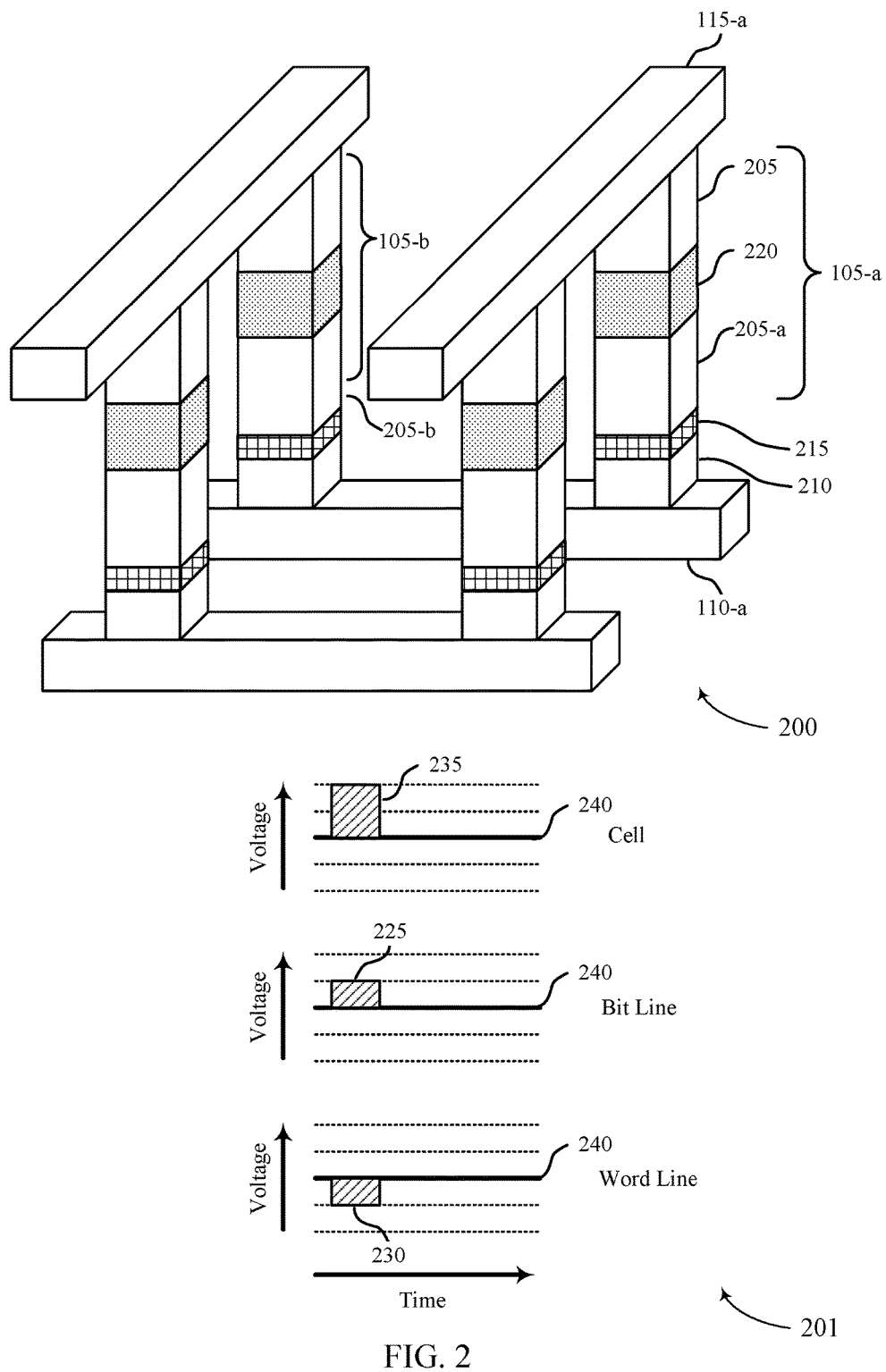
FIG. 2 illustrates an example memory array and voltage plot that supports discharging untargeted memory cells in accordance with various embodiments of the present disclosure.

FIG. 2 illustrates an example memory array 200 and an example voltage plot 201 that supports reading and writing non-volatile memory cells and discharging untargeted memory cells in accordance with various embodiments of the present disclosure. Memory array 200 may be an example of memory array 100 with reference to FIG. 1. Memory array 200 includes memory cell 105-a, memory cell 105-b, word line 110-a, and bit line 115-a, which may be examples of a memory cell 105, word line 110, and bit line 115, as described with reference to FIG. 1. Memory cell 105-a includes electrode 205, electrode 205-a, and memory element 220, which may be a ferroelectric material. Memory cell 105-b includes electrode 205-b. Electrode 205-a of memory cell 105-a and electrode 205-b of memory cell 105-b may be referred to as middle electrodes 205-a and 205-b. Memory array 200 also includes bottom electrode 210 and selection component 215. In some cases, a 3D memory array may be formed by stacking multiple memory arrays 200 on one another. The two stacked arrays may, in some examples, have common conductive lines such that each level may share word lines 110 or bit lines 115 as described with reference to FIG. 1. Memory cell 105-a may be a target memory cell. Accessing memory cell 105-a may corrupt the logic state of untargeted memory cell 105-b because memory cell 105-a and 105-b are in electronic communication through word line 110-a.

Memory array 200 may be referred to as a cross-point architecture. It may also be referred to as a pillar structure. For example, as shown in FIG. 2, a pillar may be in contact with a first conductive line (word line 110-a) and a second conductive line (bit line 115-a), where the pillar comprises a first electrode (bottom electrode 210), selection component 215, and ferroelectric memory cell 105-a, where ferroelectric memory cell 105-a includes a second electrode (electrode 205-a) ferroelectric memory element 220, and a third electrode (electrode 205). In some cases, electrode 205-a may be referred to as a middle electrode.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some cases, repeatedly accessing target memory cell 105-a (e.g., reading or writing memory cell 105-a) may disturb the stored logic states in untargeted memory cells, such as memory cell 105-b. To prevent such a disturb, various discharge voltages may be applied after accessing memory cell 105-a, or a sufficient time may elapse before a subsequent access operation is performed again.

Voltage plot 201 depicts voltages applied as a function of time during an access operation of a target memory cell 105. Prior to accessing a memory cell, such as memory cell 105-a, both the word line 110-a and digit line 115-a may be maintained at an inhibit voltage 240—i.e., a voltage that prevents discharging of the memory cell 105-a. For instance, both the word line 110-a and digit line 115-a may be maintained at an inhibit voltage 240 that is equivalent to a virtual ground. To access memory cell 105-a, both the word line 110-a and digit line 115-a may be energized by applying a voltage to them. That is, bit line access voltage 225 may be applied at the same time as word line access voltage 230. Because they have opposite polarities, the voltages applied to the word line 110-a and digit line 115-a may be additive, and the resulting voltage applied to target memory cell 105-a is cell access voltage 235. That is, in plot 201, bit line access voltage 225 has a positive polarity and word line access voltage 230 has a negative polarity, and the net sum across memory cell 105-*a* is cell access voltage 235.

In some examples, the inhibit voltage 240 may be an intermediary voltage, for example a mid-bias voltage. That is, instead of applying a positive bit line access voltage 225 and a negative word line access voltage 230 relative to a virtual ground, the bit line access voltage 225 and the negative word line access voltage 230 may be applied relative to an intermediary voltage. For instance, the memory array may be operated using only a positive voltage source and the magnitude of the intermediary voltage is between the magnitude of the positive voltage source and a virtual ground. In some examples, both bit line access voltage 225 and word line access voltage 230 are maintained at the intermediary voltage prior to an access operation of memory cell 105-*a*. And during an access operation, bit line access voltage 225 may be increased (e.g., to a positive supply rail) while word line access voltage 230 may be simultaneously decreased (e.g., to a virtual ground), generating a net voltage across memory cell 105-*a*.

Selection component 215 may, in some cases, be connected in series between a memory cell 105 and a conductive line, for example, between memory cell 105-*a* and at least one of word line 110-*a* or bit line 115-*a*. For example, as depicted in FIG. 2, selection component 215 may be located between electrode 205-*a* and bottom electrode 210; thus, selection component 215 is located in series between memory cell 105-*a* and word line 110-*a*. Other configurations are possible. For example, selection component may be located in series between memory cell 105-*a* and bit line 115-*a*. The selection component may aid in selecting a particular memory cell 105-*a* or may help prevent stray currents from flowing through non-selected memory cells 105-*a* adjacent a selected memory cell 105-*a*. It may also reduce the bias across untargeted memory cells, such as memory cell 105-*b*. For example, selection component 215 may have a threshold voltage such that a current flows through selection component 215 when the threshold voltage is met or exceeded. Selection component 215 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 215 is a chalcogenide film, for example, an alloy of selenium (Se), arsenic (As), and germanium (Ge).

Selection component 215 may be separated from memory element 220 by middle electrode 205-*a*. As such, middle electrode 205-*a* may electrically float—that is, charge may accumulate because it may not be directly connected to an electrical ground or a component capable of being electrically grounded. As such, charge may accumulate in the middle electrode 205-*a* or its interfaces with selection component 215 or memory element 220. For example, charge may build-up in middle electrode 205-*b* of untargeted memory cell 105-*b* due to the application of word line access voltage 230 during an access operation of memory cell 105-*a*. As a result, a non-zero voltage may develop. Repeatedly energizing word line 110-*a* may continue to increase the voltage, which may disturb the logic state of untargeted memory cell 105-*a*. As described below, a discharge voltage may be applied to word line 110-*a*, digit line 115-*a*, or both after accessing memory cell 105-*a*, where the discharge voltage has a polarity opposite the respective bit line access voltage 225 or word line access voltage 230.

Memory array 200 may be made by various combinations of material formation and removal. For example, layers of material may be deposited that correspond to the word line 110-*a*, bottom electrode 210, selection component 215, electrode 205-*a*, memory element 220, and electrode 205. Material may be selectively removed to then create the desired features, such as the pillar structure depicted in FIG. 2. For example, features may be defined using photolithography to pattern a photoresist and then material may be removed by techniques such as etching. Bit lines 115-*a* may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
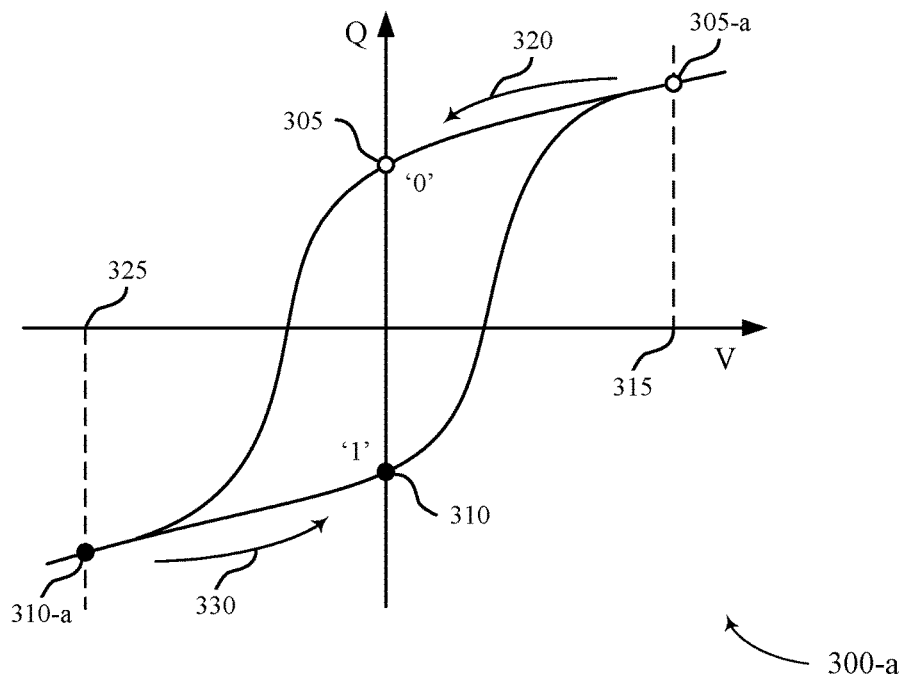
FIG. 3 illustrates example hysteresis plots for a ferroelectric memory cell that support discharging untargeted memory cells in accordance with various embodiments of the present disclosure.
Figure 3:
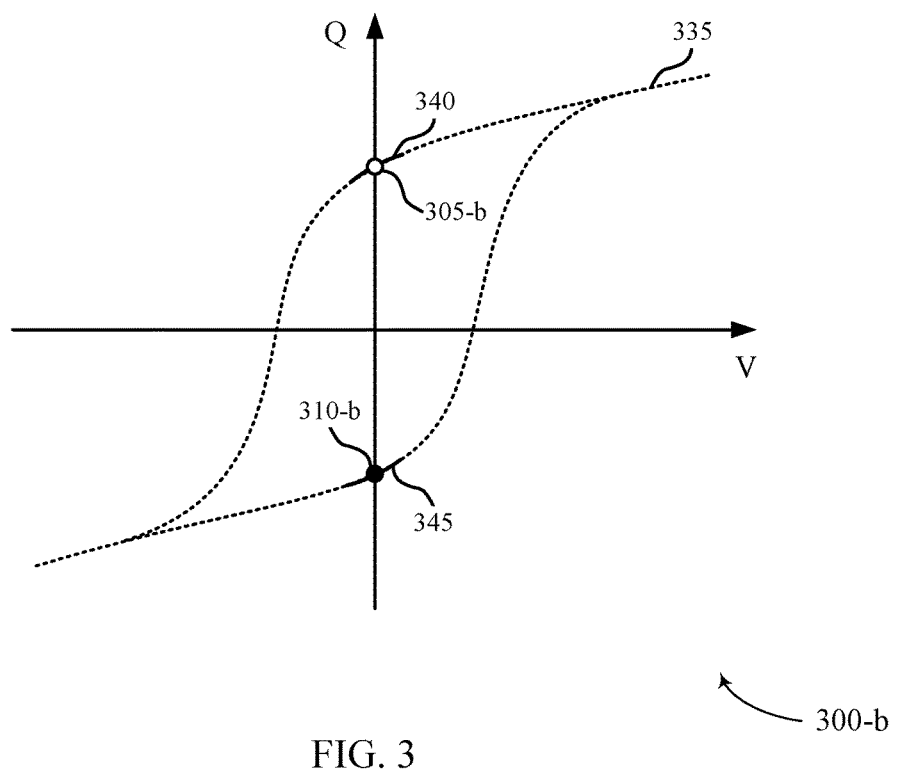

FIG. 3 illustrates examples of non-linear electrical properties, using hysteresis curves 300-*a* and 300-*b*, for a memory cell that supports discharging untargeted memory cells in accordance with various embodiments of the present disclosure. Hysteresis curves 300-*a* and 300-*b* depict the charge, Q, stored on a ferroelectric capacitor (e.g., memory cell 105-*a* of FIG. 2) as a function of a voltage difference, V. Hysteresis curves 300-*a* and 300-*b* illustrate an example ferroelectric memory cell writing process for a targeted and untargeted memory cell, respectively. For example, the targeted and untargeted memory cells 105 may be in electronic communication with each other, and both may have a selection component, for example, as shown in FIG. 2. The stored logic value of untargeted memory cell 105 may not be disturbed, as shown in hysteresis curve 300-*b*, due to repeated accesses of the targeted memory cell 105. In some cases, a common conductive line may be in electronic communication with multiple memory cells 105, and the targeted memory cell 105 may be a different target memory cell 105 for the one or more access operations, where the conductive line is energized for each access operation.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors (e.g., electrode 205, ferroelectric memory element 220, and electrode 205-*a* with respect to FIG. 2) described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays.

This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., bit line 115-a in FIG. 2) and applying a negative voltage to the second terminal (e.g., word line 110-a in FIG. 2), and vice versa to apply a negative voltage. Similarly, two positive voltages, two negative voltages, or any combination of positive and negative voltages may be applied to the appropriate conductive lines to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding or operation.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. In some examples, net positive voltage 315 may be obtained by applying a positive voltage to a bit line and a negative voltage to a word line or by applying a voltage equal to the net voltage to the bit line and driving the voltage of the word line to a virtual ground, as discussed with reference to FIG. 2. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored.

In some cases, a read operation may be followed by a write-back operation, where the originally stored logic value is written to the memory cell 105. That is, the read operation may destroy the originally stored logic value of the target memory cell 105. For example, the read process may use a positive voltage, for example, voltage 315 may be applied to the memory cell 105, although other voltages may be used. If a logic 1 was originally stored, the read voltage may result in charge state 310 following hysteresis curve 300-a until it reaches, for example, charge state 305-a, although other positions may be possible depending the exact sensing scheme. After the read voltage is removed, the charge state may not return to its original state, charge state 310, rather it may follow a different path, for example, path 320 and settle at charge state 305. In other words, a read operation of a logic 1 may result in writing a logic 0 to the memory cell. Thus, a write-back operation may be performed to return the originally stored logic value to the memory cell. For example, a negative voltage, such as voltage 325, may be applied to write-back the original logic 1 value.

A write-back operation may not be performed after reading a logic 0. For example, the read voltage may take charge state 305 to charge state 305-a and, after removing the read voltage, the charge state may return to charge state 305. That is, it may return to the originally stored logic value.

Hysteresis curve 300-b depicts an example polarization of an untargeted memory cell 105 in response to an access operation of a targeted memory cell 105 that is in electronic communication with the untargeted memory cell 105. The untargeted memory cell 105 may have a selection component 215, for example, as discussed with reference to FIG. 2. Curve 335 (dashed line) replicates the example hysteresis curve 300-a for comparison. Curves 340 and 345 (solid lines) illustrate an example response of the untargeted memory cell 105 during an access operation of the targeted memory cell 105. Curve 340 may be an example response for stored charge state 305-b (e.g., logic 0), and curve 345 may be an example response for stored charge state 310-b (e.g., logic 1).

If a selection component 215 is not associated with the untargeted memory cell 105, curves 340 and 345 may extend significantly farther down curve 335. In other words, an access operation of the target memory cell 105 may have a greater effect on the charge state of the untargeted memory cell 105 without a selection component 215. A few, or even a single, access operations may alter or even corrupt the stored logic state, which may necessitate a subsequent write-back operation to restore the corrupted logic state of the untargeted memory cell 105. In contrast, with a selection component 215, the charge state of the untargeted memory cell 105 may deviate slightly from stored charge states 305-b and 310-b, as shown by curves 340 and 345. Because of the small deviation, the charge states may return to their original or approximately original charge states 305-b or 310-b.

Figure 4:
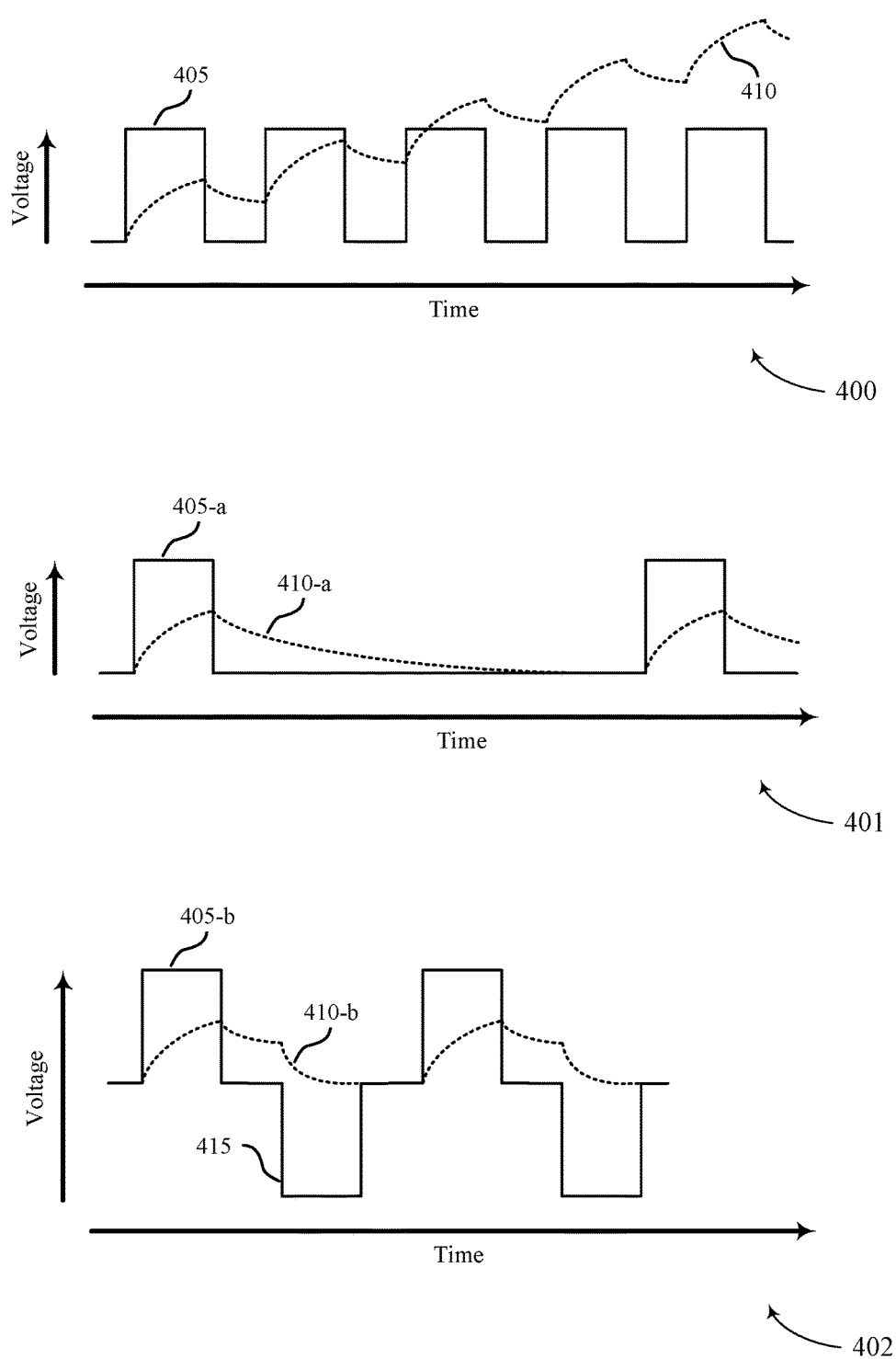
FIG. 4 illustrates example charging and discharging of untargeted memory cells in accordance with various embodiments of the present disclosure.

FIG. 4 illustrates example plots of charging and discharging untargeted memory cells 105 in response to an access operation of a target memory cell 105 in electronic communication with the untargeted memory cell 105 in accordance with various embodiments of the present disclosure. Plots 400, 401, and 402 illustrate example access and discharge voltages. FIG. 4 includes access voltages 405, 405-a, and 405-b; voltages 410, 410-a, and 410-b; and discharge voltage 415. Access voltages 405 may be applied to a conductive line that is in electronic communication with multiple memory cells 105 to access a target memory cell 105. Voltages 410 may represent a voltage across the ferroelectric capacitor of an untargeted memory cell 105. For example, voltages 410 may be the result of charge accumulation in the middle electrode of a memory cell 105, as discussed with reference to FIG. 2. Following access voltage 405, discharge voltage 415 may be applied to the same conductive line, which may discharge the middle electrode of the untargeted memory cell 105 and prevent corruption of its logic state.

Access voltage 405 may be one of two applied access voltages during the access operation of a target memory cell 105, where the second voltage is applied to a second common line that is in electronic communication with the target memory cell 105. Plots 400, 401, and 402 may also represent the second conductive line and its untargeted memory cells 105 as well.

Plot 400 illustrates an example voltage 410 of an untargeted memory cell 105 in response to access voltage 405 applied multiple times to a common conductive line. As shown in plot 400, access voltage 405 may result in an increase in voltage 410. When access voltage 405 is zero, voltage 410 decreases. If access voltage 405 is applied again before voltage 410 has returned to zero voltage, voltage 410 may continue to increase. With additional application of access voltage 405, voltage 410 may increase above that of access voltage 405. That is, voltage 410 may be greater than the voltage used during a read or write operation, which may corrupt the untargeted memory cell 105.

Plot 401 illustrates an example voltage 410-a of an untargeted memory cell 105 in response to access voltage 405-a. The elapsed time between access operations, i.e., between application of voltage 405-a, is greater than that in plot 400. Due to the increased time separation, voltage 410-a may decrease to zero following application of voltage 405-a. For example, the accumulated charge in the untargeted memory cell 105 due to the application of voltage 405-a may dissipate and, thus, voltage 410-a may decrease. This may prevent voltage 410-a from increasing to a magnitude that causes corruption of the stored logic state of the untargeted memory cell 105.

In some cases, a timer may be used between access operations. For example, a memory array 100 may contain multiple memory cells 105, and voltage 405-a may be applied to perform a first access operation for a first ferroelectric memory cell 105 (e.g., a target memory cell) of the memory array 100. A timer may be started following or in response to performing the first access operation and, based on the timer exceeding a threshold, a second access operation may be performed for at least a second ferroelectric memory cell 105 of the memory array. In some cases, the threshold is based on a discharge rate of the first ferroelectric memory cell 105, for example, the discharge rate of its middle electrode. The discharge rate may be based on the applied bias during the access operation.

In some examples, the memory array 100 may be a memory bank, a row of memory cells, a column memory cells, or any combination of rows and columns. The first and second memory cells may be in electronic communication with each other and, in some cases, may be the same memory cell.

In some examples, a charge of the second ferroelectric memory cell 105 (untargeted memory cell) may be based on the first access operation for the first ferroelectric memory cell 105 (target memory cell), and the timer threshold may be based on a time to discharge the second ferroelectric memory cell 105.

In some examples, the timer may be a count-up timer, and the second access operation may be performed based on the count-up timer exceeding a threshold. Or, the timer may be a count-down timer and the second access operation may be performed based on the expiration of the timer, i.e., reaching zero. In some examples, the timer may be reset based on performing the second access operation, that is, it may be reset and started again after the second access operation.

In some cases, a third ferroelectric memory cell 105 may be accessed before the timer exceeds the threshold. For example, the third ferroelectric memory cell 105 may not be in electronic communication with the first ferroelectric memory cell 105 and, therefore, was not affected by the first access operation. The third memory cell 105 may, for example, be in a different row or column of the memory array than the first or second memory cell 105.

Plot 402 illustrates an example voltage 410-b of an untargeted memory cell 105 in response to access voltage 405-b and a discharge voltage 415. For example, discharge voltage 415 may be applied after access voltage 405-b to discharge a middle electrode of the untargeted memory cell 105 to prevent disturbing its logic state. Discharge voltage 415 may enable repeated access operations of target memory cells 105 without disturbing untargeted memory cells 105 in electronic communication with the target memory cells 105.

After access voltage 405-b is applied, voltage 410-b begins to decrease as discussed with reference to plot 401. Applying discharge voltage 415, however, may actively discharge the untargeted memory cell 105 such that voltage 410-b decreases more quickly. This may enable a subsequent access operation (e.g., applying voltage 405-b again) to be performed more quickly compared to the passive discharge in plot 401. In other words, discharge voltage 415 may allow for continuous access of a target memory cell 105 without corrupting the stored logic value of untargeted memory cells 105. As shown, discharge voltage 415 has a polarity opposite of access voltage 405-b but may have a different voltage amplitude or time duration compared to access voltage 405-b.

Access voltage 405-b may be applied to a ferroelectric memory cell 105 during an access operation. The amplitude of the total access voltage (e.g., in conjunction with a second access voltage 405-b applied to a second conductive line in electronic communication with the ferroelectric memory cell 105) may be greater than a threshold voltage of the selection component 215. Discharge voltage 415 may be applied to the ferroelectric memory cell 105 following the access operation, where the polarity of discharge voltage 415 is opposite to the polarity of the access voltage 405-b. The amplitude of discharge voltage 415 may be less than the threshold voltage of the selection component 215. That is, the voltage applied to the memory cell during a discharge operation may be less than the threshold voltage of the selection component 215. In some examples, the amplitude of the first discharge voltage may be less than or equal to one-half of the amplitude of the access voltage. In other examples, the amplitude of the first discharge voltage may be greater than one-half the access voltage but may have a shorter time duration than the access voltage. In some cases, the selection component 215 may be a metal-semiconductor switch, a metal-semiconductor-metal switch, a chalcogenide material, or a similar electrically non-linear device or component.

FIGS. 5A, 5B, 5C, and 5D illustrate plots of example discharge voltages that support discharging untargeted memory cells in accordance with various embodiments of the present disclosure. Voltage plots 500-511 illustrate example access operations (e.g., read or write) of a memory cell followed by discharge operations to prevent the corruption of the logic state of untargeted memory cells. Each voltage plot 500-511 depicts voltages applied as a function of time for a bit line 115 and a word line 110, as well as the resulting net voltage applied to the memory cell 105 located at the intersection of the respective bit line 115 and word line 110. The word line 110, bit line 115, and memory cell 105 may be part of a memory array as discussed with reference to FIGS. 1 and 2. Voltage plots 500-511 include bit line access voltage 520, word line access voltage 525, and cell access voltage 515, which may be an example of bit line access voltage 225, word line access voltage 230, and cell access voltage 235, respectively, as discussed with reference to FIG. 2. Applying bit line access voltage 520 to a bit line 115 and word line access voltage 525 to a word line 110 may result in cell access voltage 515. Voltage plots 500-511 may include bit line discharge voltage 535, word line discharge voltage 540, and cell discharge voltage(s) 530. In some cases, voltage plots 506-511 of FIGS. 5C and 5D, the voltage plots include cell write-back voltage 545, bit line write-back voltage 550, and word line write-back voltage 555, where a logic state is written back to the memory cell following a read operation, as discussed above.

In one example, the memory cells of the memory array may be in electronic communication with a selection component 215, where the selection component may be an electrically non-linear component. A first voltage may be applied to a first conductive line that is in electronic communication with the ferroelectric memory cell, where the first voltage is applied during an access operation, and a second voltage may be applied to a second conductive line that is in electronic communication with the selection component, where the second voltage has an opposite polarity from the first voltage and is applied during the access operation. In some cases, the first and second voltages may have a same amplitude, but other amplitudes are possible. For example, bit line access voltage 520 may be applied to a bit line 115 and word line access voltage 525 may be applied to a word line 110. The bit line access voltage 520 and word line access voltage 525 may be applied at the same time and may result in cell access voltage 515. That is, the resulting cell access voltage 515 may be the voltage across the ferroelectric memory cell 105 and the selection component 215 during the access operation and may be a difference between the bit line access voltage 520 and word line access voltage 525.

A discharge voltage may be applied to the bit line 115 or word line 110 or both following an access operation of a target memory cell. This may discharge untargeted memory cells 105 and prevent corruption of their stored data. For example, a third voltage may be applied to the first conductive line during a discharge operation following the access operation, where the third voltage may have an opposite polarity from the first voltage and an amplitude that is based on a threshold voltage of the selection component 215. For example, bit line discharge voltage 535 may be applied to the bit line after the access operation. In some examples, the amplitude of the third voltage may be less than or equal to the amplitude of the first voltage. In other cases, the amplitude may be greater, for example, when applied for a shorter time period. In some cases, the first voltage may be applied for a first time period and the third voltage may be applied for a second time period that is less than or equal to the first time period. As shown, bit line discharge voltage 535 has an opposite polarity as bit line access voltage 520. During the discharge operation, the voltage across the ferroelectric memory cell 105 and the selection component 215 may be equal to the third voltage, which may be less than the threshold voltage of selection component 215.

A fourth voltage may be applied to the second conductive line during the discharge operation, where the fourth voltage has an opposite polarity from the second voltage and an amplitude that may be based on a threshold voltage of the selection component 215. That is, word line discharge voltage 540 may be applied to the word line 110, where word line discharge voltage 540 has a polarity opposite of word line access voltage 525. In some cases, word line discharge voltage 540 may be applied after bit line discharge voltage 535, however, their application may be reversed. In some cases, the amplitude of the fourth voltage may be equal to an amplitude of the third voltage, however, they may different in some cases.

Various combinations of voltage amplitude and timing may be used for the discharge operation, which are illustrated in voltage plots 500-511 and are discussed in more detail below. The discharging of untargeted memory cells 105 may be based on the amplitude and total time period of the discharge voltage. In some cases, the voltage across the ferroelectric memory cell 105 and the selection component 215 during the access operation (e.g., cell access voltage 515) may be greater than the threshold voltage of the selection component 215. During the discharge operation, the voltage across the ferroelectric memory cell 105 and the selection component 215 (e.g., cell discharge voltage 530) may be less than the threshold voltage of the selection component. In some cases, the discharge voltage may be applied to each conductive line at separate times, as shown in voltage plot 500. In other cases, bit line discharge voltage 535 and word line discharge voltage 540 may be applied at the same time but their voltage amplitudes may be lower such that cell discharge voltage 530 is less than the threshold voltage of the selection component 215 (e.g., as shown in voltage plot 501). In other words, cell discharge voltage 530 may be a difference between the bit line discharge voltage 535 and word line discharge voltage 540 and may be less than the threshold voltage. The different voltage amplitudes discussed herein may be the output of a voltage regulator, for example, as described below in FIG. 6.

Figure 5A:
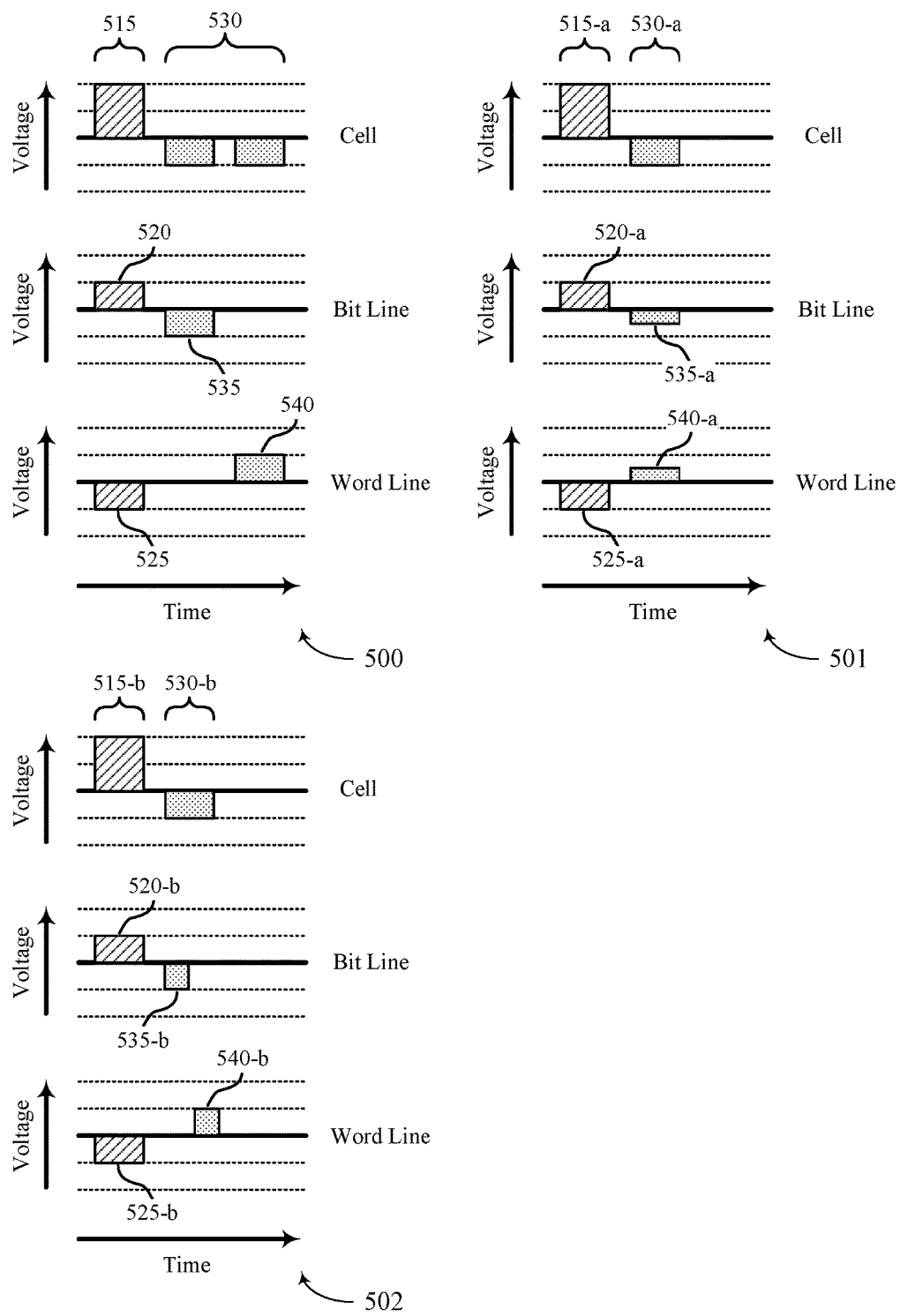
FIGS. 5A-5D illustrate plots of example discharge voltages that support discharging untargeted memory cells in accordance with various embodiments of the present disclosure.

FIGS. 5A-5D present examples of specific access and discharge operations. FIG. 5A illustrates example voltage plots 500-502 for discharge operations following a logic 0 read or write operation. For example, as discussed with reference to FIG. 3, a logic 0 may be written by applying a positive voltage to the memory cell. Further, when a memory cell is read, a positive voltage may be applied. If a logic 0 was originally stored, a write-back operation may not be needed, as discussed with reference to FIG. 3.

In each case of a logic 0 read or write operation, a positive cell access voltage is applied to the memory cell. For example, cell access voltages 515, 515-a, and 515-b are positive, and each is a sum of the respective bit line access voltages 520, 520-a, 520-b and word line access voltages 525, 525-a, 525-b. Bit line access voltages 520, 520-a, and 520-b have a positive polarity, and word line access voltages 525, 525-a, and 525-b have a negative polarity. All polarities may be reversed without loss of understanding or operation. Although illustrated with approximately equal amplitudes, bit line access voltages 520, 520-a, and 520-b and word line access voltages 525, 525-a, and 525-b may have different amplitudes.

Voltage plot 500 illustrates a first example discharge operation following a logic 0 read or write operation. After the access operation, bit line discharge voltage 535 may be applied, where bit line discharge voltage 535 may have a voltage amplitude that is approximately equal to bit line access voltage 520 but with an opposite polarity. Following bit line discharge voltage 535, word line discharge voltage 540 may be applied, where word line discharge voltage 540 may have a voltage amplitude that is approximately equal to word line access voltage 525 but with an opposite polarity. In some cases, the respective amplitudes of the access and discharge voltages may be different. Although shown with approximately equal amplitudes, bit line discharge voltage 535 and word line discharge voltage 540 may have different amplitudes. Further, the time duration of the voltages may vary from one another. In some examples, the order of discharge voltages may be reversed—word line discharge voltage 540 may be applied before bit line discharge voltage 535.

Voltage plot 501 illustrates a simultaneous application of discharge voltages following the access operation. This may, for example, reduce the total time period of the discharge operation. For example, bit line discharge voltage 535-a may have a voltage amplitude less than bit line access voltage 520-a and may have a polarity opposite to bit line access voltage 520-a. Word line discharge voltage 540-a may have a voltage amplitude less than word line access voltage 525-a and have an opposite polarity compared to word line access voltage 525-a. Since the discharge voltages are applied at the approximately same time, cell discharge voltage 530-a is the sum of bit line discharge voltage 535-a and word line discharge voltage 540-a, where cell discharge voltage 530-a is less than the threshold of the selection component 215. Although shown with approximately equal amplitudes, bit line discharge voltage 535-a and word line discharge voltage 540-a may have different amplitudes. Their time duration may be different compared bit line access voltage 520-a and word line access voltage 525-a as well.

In some cases, shorter discharge pulses may be used as shown in voltage plot 502. After the access operation, bit line discharge voltage 535-b may be applied, where bit line discharge voltage 535-b may have a voltage amplitude that is approximately equal to bit line access voltage 520-b but with an opposite polarity. In some cases, the amplitude may be different. Bit line discharge voltage 535-b may be applied for a time period less than bit line access voltage 520-b. Approximately immediately following bit line discharge voltage 535-b, word line discharge voltage 540-b may be applied, where word line discharge voltage 540-b may have a voltage amplitude that is approximately equal to word line access voltage 525-b but with an opposite polarity. In some cases, the amplitude may be different. Cell discharge voltage 530-b may be the sum of bit line discharge voltage 535-b and word line discharge voltage 540-b. Although shown with approximately equal amplitudes, bit line discharge voltage 535-b and word line discharge voltage 540-b may have different amplitudes. In some examples, the order of discharge voltages may be reversed—word line discharge voltage 540-b may be applied before bit line discharge voltage 535-b.

Figure 5B:
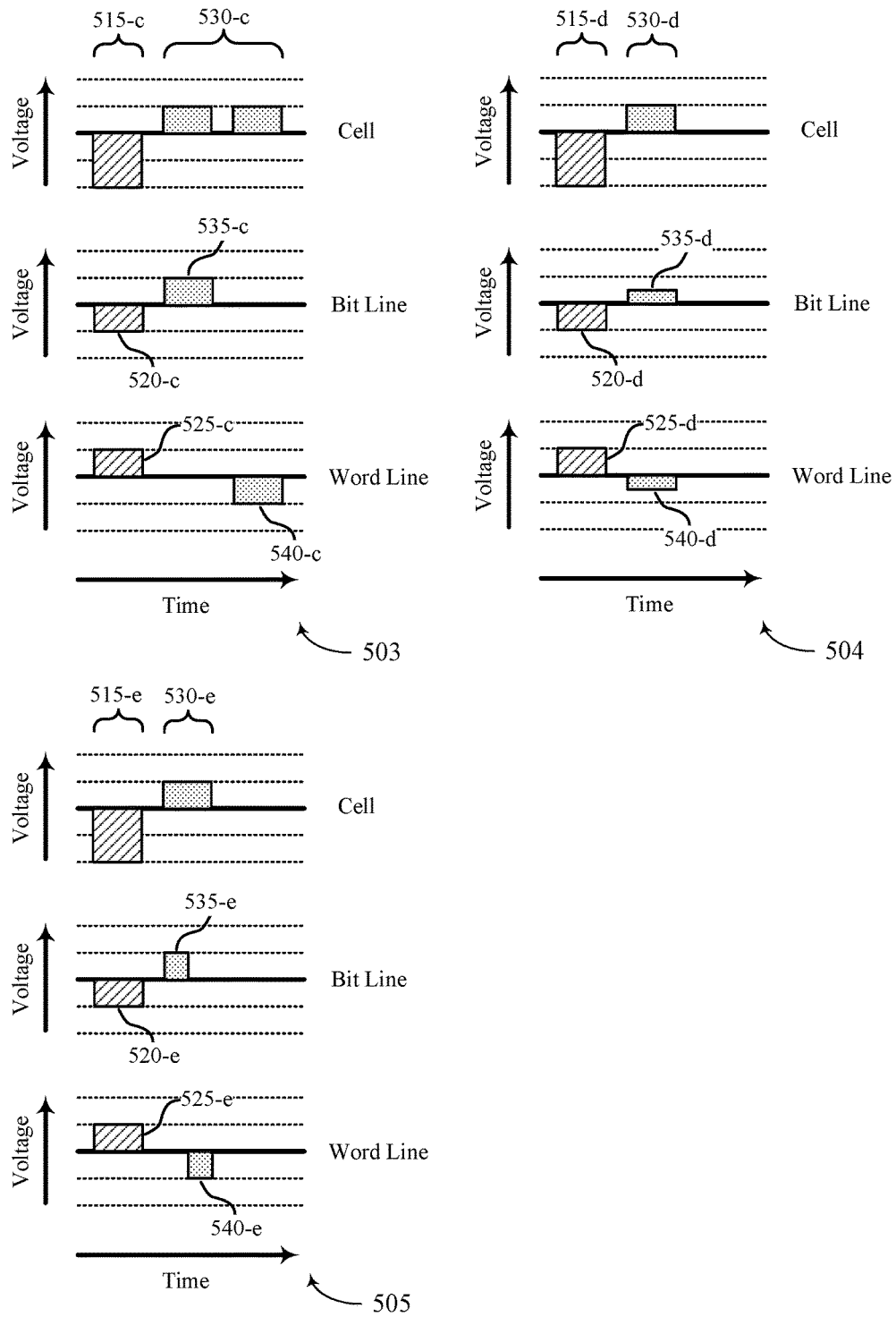

FIG. 5B illustrates example voltage plots 503-505 for discharge operations following a logic 1 write operation. For example, as discussed with reference to FIG. 3, logic 1 may be written by applying a negative voltage to the memory cell. As shown in voltage plots 503-505, each logic 1 write operation applies a negative cell access voltage to the memory cell.

For example, cell access voltages 515-c, 515-d, and 515-e are negative, and each is a sum of the respective bit line access voltages 520-c, 520-d, 520-e and word line access voltages 525-c, 525-d, 525-e. Bit line access voltages 520-c, 520-d, 520-e have a negative polarity, and word line access voltages 525-c, 525-d, 525-e have a positive polarity. All polarities may be reversed without loss of understanding or operation. Although illustrated with approximately equal amplitudes, bit line access voltages 520-c, 520-d, 520-e and word line access voltages 525-c, 525-d, 525-e may have different amplitudes.

Voltage plot 503 illustrates a first example discharge operation following a logic 1 write operation. After the access operation, bit line discharge voltage 535-c may be applied, where bit line discharge voltage 535-c may have a voltage amplitude that is approximately equal to bit line access voltage 520-c but with an opposite polarity. In some cases, the amplitudes may be different. Following bit line discharge voltage 535-c, word line discharge voltage 540-c may be applied, where word line discharge voltage 540-c may have a voltage amplitude that is approximately equal to word line access voltage 525-c but with an opposite polarity. In some cases, the amplitudes may be different. As such, although shown with approximately equal amplitudes, bit line discharge voltage 535-c and word line discharge voltage 540-c may have different amplitudes. In some examples, the order of discharge voltages may be flipped—word line discharge voltage 540-c may be applied before bit line discharge voltage 535-c. Further, the relative time duration of the voltages may.

Voltage plot 504 illustrates a second example discharge operation following a logic 1 write operation. After the access operation, both bit line discharge voltage 535-d and word line discharge voltage 540-d may be applied at the same time. For example, bit line discharge voltage 535-d may have a voltage amplitude less than and a polarity opposite to bit line access voltage 520-d. Word line discharge voltage 540-d may have a voltage amplitude less than and a polarity opposite to word line access voltage 525-d. Since the discharge voltages are applied at the approximately same time, cell discharge voltage 530-d is the sum of bit line discharge voltage 535-d and word line discharge voltage 540-d. Although shown with approximately equal amplitudes, bit line discharge voltage 535-d and word line discharge voltage 540-d may have different amplitudes. Further, the time duration of the access and discharge voltages may vary from one another.

Voltage plot 505 illustrates a third example discharge operation with shorter discharge voltages following a logic 1 write operation. After the access operation, bit line discharge voltage 535-e may be applied, where bit line discharge voltage 535-e may have a voltage amplitude that is approximately equal to bit line access voltage 520-e but with an opposite polarity. Other amplitudes may be possible. Bit line discharge voltage 535-e may be applied for a time period less than bit line access voltage 520-e. Approximately immediately following bit line discharge voltage 535-e, word line discharge voltage 540-e may be applied, where word line discharge voltage 540-e may have a voltage amplitude that is approximately equal to word line access voltage 525-e but with an opposite polarity. In some cases, the amplitudes may be different. Thus, cell discharge voltage 530-e may be the sum of bit line discharge voltage 535-e and word line discharge voltage 540-e. Although shown with approximately equal amplitudes, bit line discharge voltage 535-e and word line discharge voltage 540-e may have different amplitudes. In some examples, the order of discharge voltages may be flipped—word line discharge voltage 540-e may be applied before bit line discharge voltage 535-e.

Figure 5C:
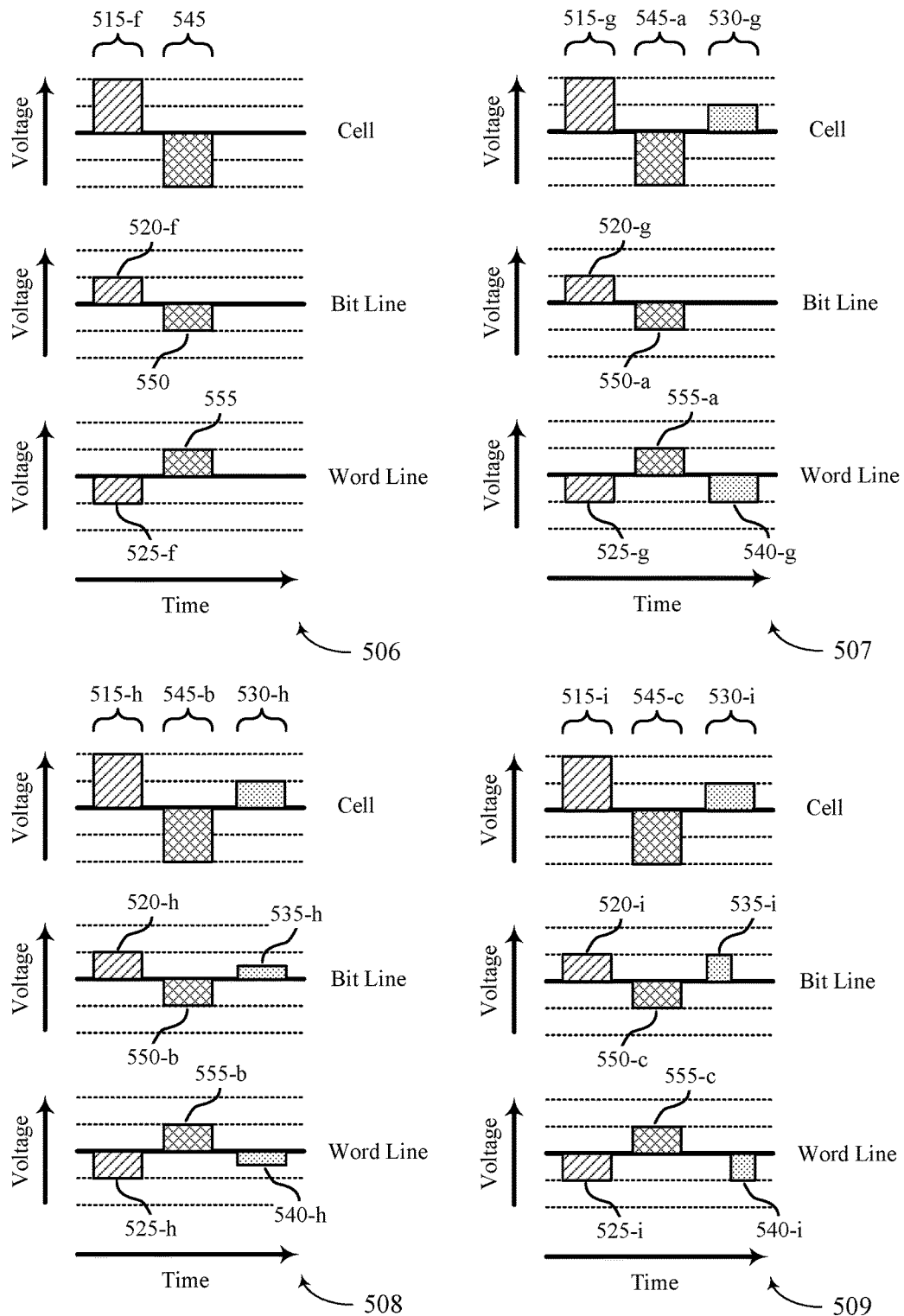
Figure 5D:
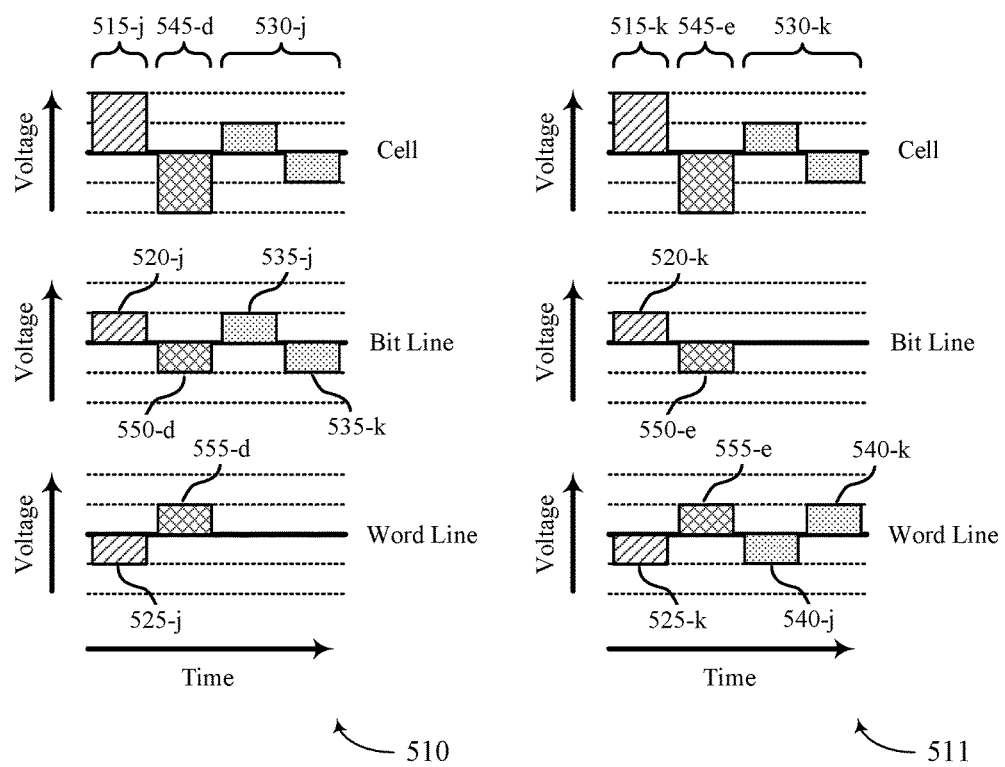

FIGS. 5C and 5D illustrate example voltage plots 506-511 for discharge operations following logic 1 read operation. As discussed with reference to FIG. 3, following a logic 1 read, a write-back operation may be performed to restore the logic 1 value back to the memory cell.

Voltage plot 506 illustrates a possible write-back operation. A positive voltage may be applied to the memory cell during the sense operation, for example, cell access voltage 515-f. If a logic 1 was originally stored, it may need to be restored to the memory cell. Thus, cell write-back voltage 545 may be applied to the memory cell to write a logic 1. For example, cell write-back voltage 545 may be negative, as shown in voltage plot 506. In some cases, all voltage polarities may be reversed without loss of understanding or operation.

In each voltage plot 506-511, a positive cell access voltage is applied to the memory cell, followed by a write-back voltage. For example, cell access voltages 515-$f$, 515-$g$, 515-$h$, 515-$i$, 515-$j$, and 515-$k$ are positive, and each is a sum of the respective bit line access voltages 520-$f$, 520-$g$, 520-$h$, 520-$i$, 520-$j$, 520-$k$ and word line access voltages 525-$f$, 525-$g$, 525-$h$, 525-$i$, 525-$j$, 525-$k$. Bit line access voltages 520-$f$, 520-$g$, 520-$h$, 520-$i$, 520-$j$, and 520-$k$ have a positive polarity, and word line access voltages 525-$f$, 525-$g$, 525-$h$, 525-$i$, 525-$j$, and 525-$k$ have a negative polarity. Cell write-back voltages 545, 545-$a$, 545-$b$, 545-$c$, 545-$d$, and 545-$e$ are negative, and each is a sum of the respective bit line write-back voltages 550, 550-$a$, 550-$b$, 550-$c$, 550-$d$, 550-$e$ and word line write-back voltages 555, 555-$a$, 555-$b$, 555-$c$, 555-$d$, 555-$e$. Bit line write-back voltages 550, 550-$a$, 550-$b$, 550-$c$, 550-$d$, and 550-$e$ have a negative polarity, and word line write-back voltages 555, 555-$a$, 555-$b$, 555-$c$, 555-$d$, and 555-$e$ have a positive polarity. All polarities may be reversed without loss of understanding or operation. Although illustrated with approximately equal amplitudes, bit line access voltages 520-$f$, 520-$g$, 520-$h$, 520-$i$, 520-$j$, and 520-$k$ and word line access voltages 525-$f$, 525-$g$, 525-$h$, 525-$i$, 525-$j$, and 525-$k$ may have different amplitudes. Further, bit line write-back voltages 550, 550-$a$, 550-$b$, 550-$c$, 550-$d$, and 550-$e$ and word line write-back voltages 555, 555-$a$, 555-$b$, 555-$c$, 555-$d$, and 555-$e$ may have different amplitudes as well. Further, the relative time duration of the voltages may.

Referring to voltage plot 506, because cell write-back voltage 545 is opposite of cell access voltage 515-$f$, the write-back operation may effectively discharge the untargeted memory cells. For example, bit line write-back voltage 550 has a polarity opposite of bit line access voltage 520-$f$, and word line write-back voltage 555 has a polarity opposite of word line access voltage 525-$f$. Because the write-back operation programs a logic value in the memory cell, the bit line write-back voltage 550 and word line write-back voltage 555 are applied at the same time. Although shown with approximately equal amplitudes, bit line write-back voltage 550 and word line write-back voltage 555 may have different amplitudes.

In some cases, however, a discharge operation may follow the write-back operation, as shown in voltage plots 507-511. Voltage plot 507 illustrates such an example discharge operation following a write-back operation. For example, following the write-back operation, word line discharge voltage 540-$g$ may be applied, where it has a polarity opposite of word line write-back voltage 555-$a$. Thus, cell discharge voltage 530-$g$ may be equal to word line discharge voltage 540-$g$. Although illustrated with approximately equal amplitudes, word line write-back voltage 555-$a$ and word line discharge voltage 540-$g$ may have different amplitudes.

In other cases, the bit line may be discharged and not the digit line. For example, following the write-back operation, a voltage may be applied to the bit line, where its voltage has a polarity opposite of bit line write-back voltage 550-$a$. Resultantly, cell discharge voltage 530-$g$ would have an opposite polarity than shown in voltage plot 507.

In other cases, two discharge voltages may be applied. Voltage plot 508 illustrates such a discharge operation following a write-back operation. A discharge voltage may be applied to each conductive line simultaneously. For example, bit line discharge voltage 535-$h$ may be applied, where its polarity is opposite of bit line write-back voltage 550-$b$ and its amplitude is less than bit line write-back voltage 550-$b$. Word line discharge voltage 540-$g$ may be applied simultaneously, where its polarity is opposite of word line write-back voltage 555-$b$ and its amplitude is less than word line write-back voltage 555-$b$. Thus, the cell discharge voltage 530-$h$ may be a sum of bit line discharge voltage 535-$h$ and word line discharge voltage 540-$h$. Although illustrated with approximately equal amplitudes, bit line discharge voltage 535-$h$ and word line discharge voltage 540-$h$ may have different amplitudes.

Voltage plot 509 illustrates a further example discharge operation following a write-back operation. A discharge voltage may be applied to each conductive line approximately immediately after the other. For example, bit line discharge voltage 535-$i$ may be applied, where its polarity is opposite of bit line write-back voltage 550-$c$. Following bit line discharge voltage 535-$i$, word line discharge voltage 540-$i$ may be applied, where its polarity is opposite of word line write-back voltage 555-$c$. Thus, the cell discharge voltage 530-$i$ may be the result of bit line discharge voltage 535-$i$ and word line discharge voltage 540-$i$. Although illustrated with approximately equal amplitudes, bit line discharge voltage 535-$i$ and word line discharge voltage 540-$i$ may have different amplitudes. In some cases, the application of bit line discharge voltage 535-$i$ and word line discharge voltage 540-$i$ may be reversed.

Voltage plot 510 of FIG. 5D illustrates an example discharge operation with two discharge voltages applied to a single conductive line following a write-back operation. For example, bit line discharge voltage 535-$j$ and bit line discharge voltage 535-$k$ may be applied. The polarity of bit line discharge voltage 535-$j$ may be opposite of bit line write-back voltage 550-$d$. Bit line discharge voltage 535-$k$ may then be applied, where its polarity is opposite of bit line discharge voltage 535-$j$. Thus, the cell discharge voltage 530-$j$ may be due to the bit line discharge voltages 535-$j$ and 535-$k$. Although illustrated with approximately equal amplitudes, bit line discharge voltage 535-$j$ and bit line discharge voltage 535-$k$ may have different amplitudes.

A similar operation may be applied to the word line, as illustrated in voltage plot 511. Following the write-back operation, two discharge voltages may be applied to the word line 110. For example, word line discharge voltage 540-$j$ and word line discharge voltage 540-$k$ may be applied. The polarity of word line discharge voltage 540-$j$ may be opposite of word line write-back voltage 555-$e$. Word line discharge voltage 540-$k$ may then be applied, where its polarity is opposite of word line discharge voltage 540-$j$. Thus, the cell discharge voltage 530-$k$ may be due to the word line discharge voltages 540-$j$ and 540-$k$. Although illustrated with approximately equal amplitudes, word line discharge voltage 540-$j$ and word line discharge voltage 540-$k$ may have different amplitudes.

Although discharge voltages 530 through 540 as described with reference to FIGS. 5A through 5D are generally discussed as being applied with either a positive or negative polarity relative to a virtual ground, in some examples the discharge voltages 530 through 540 are applied relative to an intermediary voltage. That is, the bit and word lines may be maintained at an intermediary voltage (e.g., between a positive supply rail and a virtual ground) prior to accessing a memory cell. And during an access operation the voltages applied to the bit and word lines may be driven in opposite directions (e.g., the bit line voltage may be driven to a greater voltage then the intermediary voltage, while the word line voltage may be driven to a voltage less than the intermediary voltage so that the net voltage resulting across the memory cell is equivalent to the voltage of the supply rail. For instance, as discussed with reference to FIG. 5A, the discharge voltage 535 may be applied to the bit line by driving the discharge voltage to virtual ground while subsequent discharge voltage 540 may be applied to the word line by increasing the intermediary voltage (e.g., to a voltage supply rail). Therefore, a memory array may operate with only a positive voltage source while the magnitude of the net discharge voltage 530 applied across the memory cell may remain the same as in the previous discussion of FIGS. 5A through 5D.

Figure 6:
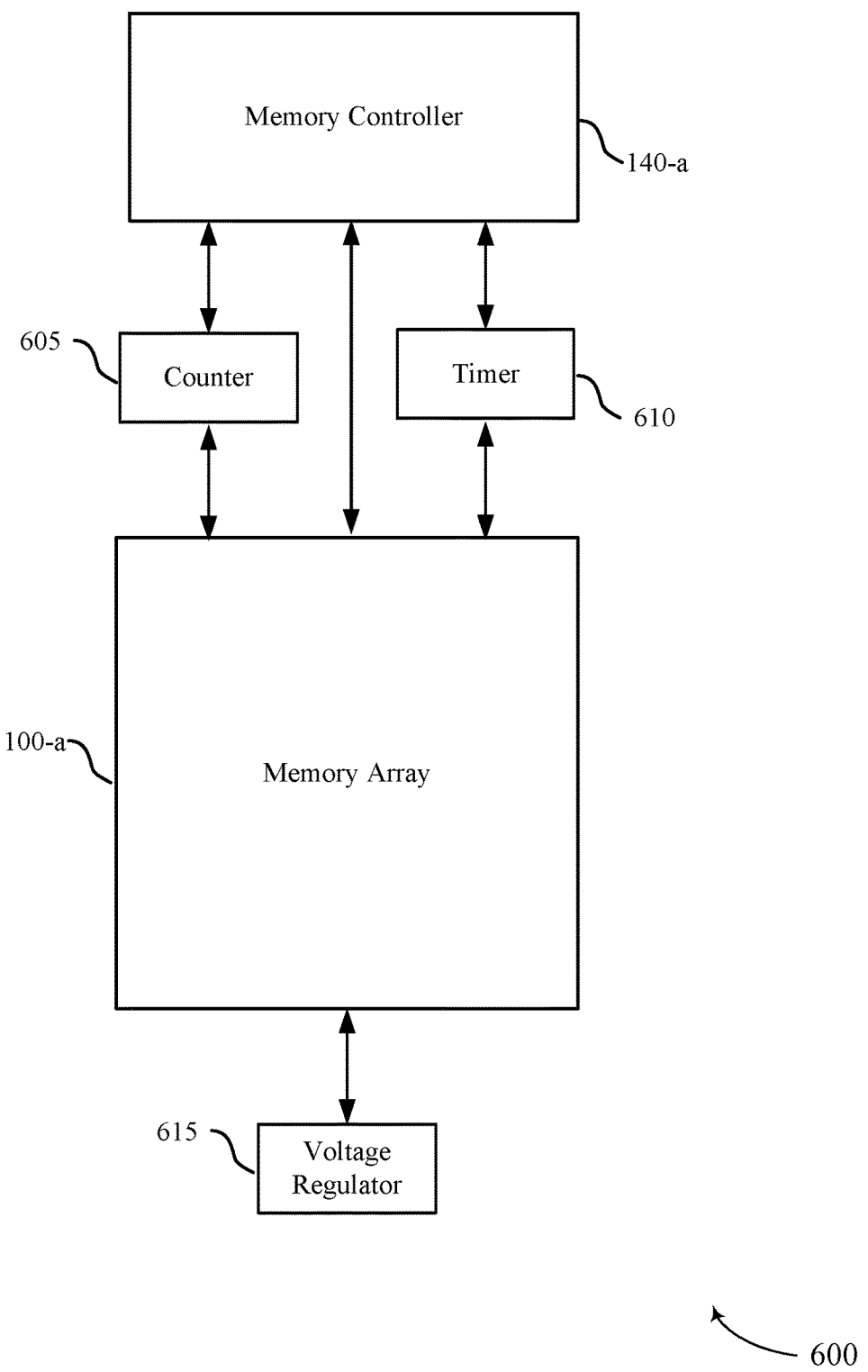
FIG. 6 illustrates a system, including a memory array, that supports discharging untargeted memory cells in accordance with various embodiments of the present disclosure.

FIG. 6 illustrates a system that supports discharging an untargeted memory cells in accordance with various embodiments of the present disclosure. System 600 includes memory array 100-a, which may be an example of a memory array 100 or 200 with reference to FIGS. 1 and 2. System 600 includes memory controller 140-a, which may be an example of a memory controller 140 with reference to FIG. 1. System 600 includes counter 605, timer 610, and voltage regulator 615. In some cases, system 600 may include only one of counter 605 or timer 610. In some examples, one or more of memory controller 140-a, counter 605, timer 610, voltage regulator 615, and memory array 100-a may be co-located together. In some example, memory array 100-a may be a memory bank, which may include multiple rows or columns of a memory array.

Memory array 100-a may include ferroelectric memory cells 105. In some cases, the memory cells 105 may have a pillar structure as discussed with reference to FIG. 2. A selection component 215 may be in electronic communication with each memory cell 105 and may be positioned between a first conductive line and a second conductive line. Memory controller 140-a may be in electronic communication with the first conductive line and the second conductive line, where memory controller 140-a may apply access and discharge voltages to the conductive lines as described with reference to FIGS. 5A-5D. For example, during an access operation, memory controller 140-a may apply a first voltage to the first conductive line and a second voltage to the second conductive line. The second voltage may have an opposite polarity from the first voltage, where a voltage across the ferroelectric memory cell 105 and the selection component 215 during the access operation may be the difference between the first voltage and second voltage. Memory controller 140-a may also apply a third voltage to the first conductive line during a discharge operation following the access operation, where the third voltage has an opposite polarity from the first voltage and may have an amplitude that is based at least in part on a threshold voltage of the selection component 215. For example, the third voltage may be less than the threshold voltage of the selection component 215.

In some examples, memory controller 140-a may apply a fourth voltage to the second conductive line during the discharge operation, where the fourth voltage has an opposite polarity from the second voltage and may have an amplitude based at least in part on a threshold voltage of the selection component. For example, the third voltage may be less than the threshold voltage of the selection component 215.

In other examples, the discharge operation may be applied after some number of access operations. For example, an access voltage may be applied to a ferroelectric memory cell 105 during an access operation, where an amplitude of the access voltage is greater than a threshold voltage of the selection component 215, and a counter may be incremented based on applying the access voltage. A discharge voltage may be applied to the ferroelectric memory cell 105 based on the counter exceeding a threshold, where the polarity of the discharge voltage is opposite the polarity of the access voltage, and where the amplitude of the discharge voltage may be less than the threshold voltage of the selection component 215. In some cases, the threshold comprises a rate of access attempts of the ferroelectric memory cell.

In some cases, the memory array 100-a may include a plurality of memory cells 105, which may include the ferroelectric memory cell 105, and applying the discharge voltage to the ferroelectric memory cell 105 may include applying the discharge voltage to the plurality of memory cells 105 of memory array 100-a. In some cases, the discharge voltage may be applied to a subset of the plurality of memory cells 105 of memory array 100-a.

In other cases, the ferroelectric memory cell 105 and the selection component 215 may be in electronic communication with a first conductive line and a second conductive line, where applying the access voltage to the ferroelectric memory cell comprises applying a first voltage to the first conductive line and applying a second voltage to the second conductive line, where the access voltage comprises a voltage difference between the first voltage and the second voltage. Applying the discharge voltage to the ferroelectric memory cell may include applying a third voltage to the first conductive line, where the third voltage has an opposite polarity from the first voltage, and where a voltage across the ferroelectric memory cell 105 and the selection component 215 comprises the third voltage. In some examples, applying the discharge voltage to the ferroelectric memory cell includes applying a fourth voltage to the second conductive line after the third voltage is applied to the first conductive line, where the fourth voltage has an opposite polarity from the second voltage, and where a voltage across the ferroelectric memory cell 105 and the selection component 215 comprises the fourth voltage. In other examples, applying the discharge voltage to the ferroelectric memory cell includes applying a fourth voltage to the second conductive line simultaneously with the third voltage, where the fourth voltage has an opposite polarity from the second voltage, and where a voltage across the ferroelectric memory cell and the selection component comprises a difference between the fourth voltage and the third voltage. The memory controller 140-a may apply some or all of the access and discharge voltages.

As described above, the discharge operation may be applied after some number of access operations. For example, memory controller 140-a may increment counter 605 based on applying the first voltage or the second voltage during the access operation. If counter 605 exceeds a threshold value, memory controller 140-a may apply the third voltage to the first conductive line during a discharge operation. Memory controller 140-a may reset the counter based on applying the third voltage, for example, it may reset the counter after the discharge operation.

In other examples, the discharge operation may be applied after a timer expires. For example, memory controller 140-a may start timer 610 based on applying the first voltage or the second voltage during the access operation of a first memory cell 105. Memory controller 140-a may not access any memory cells 105 that are in electronic communication with the first memory cell 105 until timer 610 expires. In other cases, memory controller 140-a may perform an access operation before timer 610 expires. In such cases, memory controller 140-a may apply a discharge voltage to one or more conductive lines.

In some examples, the voltages applied during access operations and discharge operations may be different, for example, as discussed with reference to FIGS. 5A-5D. Voltage regulator 615 may provide the different voltages. For example, the amplitude of the third voltage (e.g., discharge voltage) may be based on an output of voltage regulator 615, and memory controller 140-a may apply the third voltage to the first or second conductive line during the discharge operation, where the amplitude of the third voltage is less than the amplitude of the first voltage.

Figure 7:
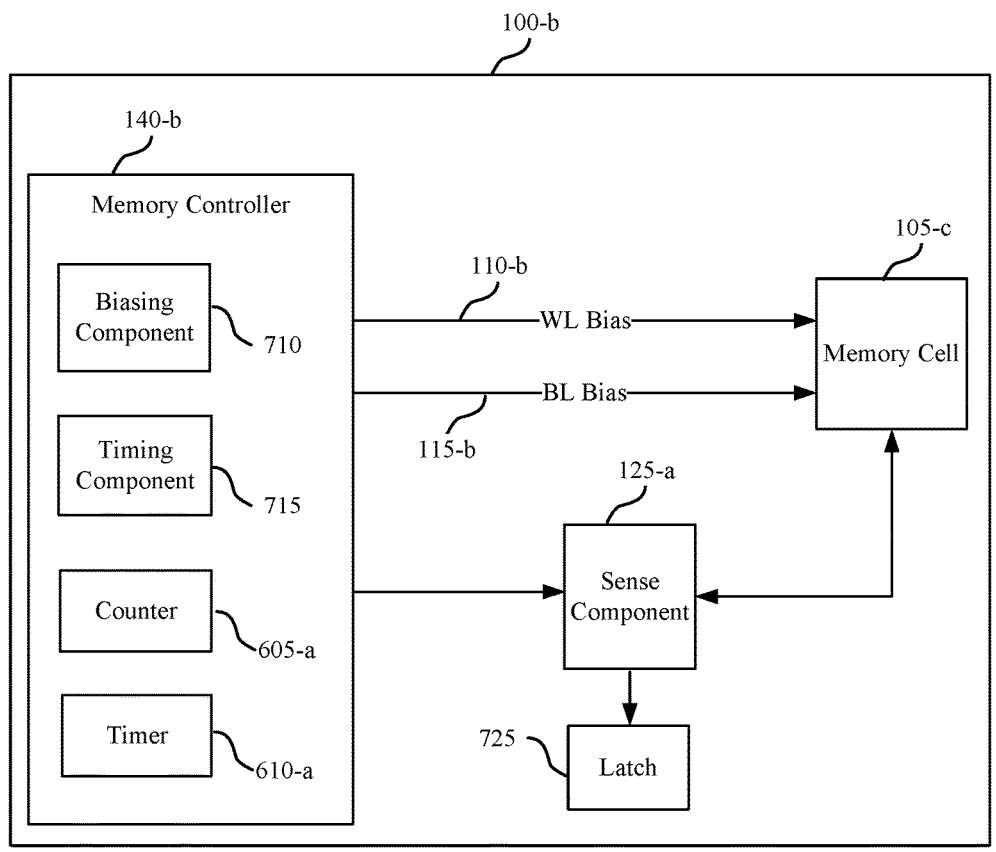
FIG. 7 illustrates a memory array that supports discharging untargeted memory cells in accordance with various embodiments of the present disclosure.

FIG. 7 shows a block diagram 700 of a memory array 100-b that supports discharging untargeted memory cells in accordance with various embodiments of the present disclosure. Memory array 100-b may be referred to as an electronic memory apparatus and may include memory controller 140-b and memory cell 105-c, which may be examples of memory controller 140 and memory cell 105 described with reference to FIGS. 1, 2, and 6. Memory controller 140-b includes counter 605-a and timer 610-a, which may be examples of counter 605 and timer 610 with reference to FIG. 6. Memory controller 140-b also includes biasing component 710 and timing component 715 and may operate memory array 100-b as described in FIGS. 1, 2, 4, 5A-5D, and 6. Memory controller 140-b may be in electronic communication with word line 110-b, bit line 115-b, and sense component 125-a, which may be examples of word line 110, bit line 115, and sense component 125, described with reference to FIGS. 1, 2, 3, and 5A-5D. Memory array 100-b may also include latch 725. The components of memory array 100-b may be in electronic communication with one another and may perform the functions described with reference to FIGS. 1, 2, 3, 4, 5A-5D, and 6. In some cases, sense component 125-a and latch 725 may be components of memory controller 140-b.

Memory controller 140-b may be configured to activate word line 110-b or bit line 115-b by applying voltages or currents to those nodes. For example, biasing component 710 may be configured to apply a voltage to operate memory cell 105-c to read or write memory cell 105-c as described above. Biasing component 710 may also apply write-back or discharge voltages to word line 110-b and digit line 115-b as described above. In some cases, memory controller 140-b may include a row decoder or column decoder, or both, as described with reference to FIG. 1. This may enable memory controller 140-b to access one or more memory cells 105-e and discharge one or more untargeted memory cells 105 in electronic communication with word line 110-b or bit line 115-b. Biasing component 710 may include various voltage regulators to generate different voltage amplitudes. Biasing component 710 may also provide voltages to operate sense component 125-a.

In some cases, memory controller 140-b may perform its operations using timing component 715. For example, timing component 715 may control the timing of the various word line or bit line selections, including timing for switching and voltage application to perform the memory functions, such as reading, writing, write-back, and discharging as discussed herein. In some cases, timing component 715 may control the operations of biasing component 710.

Sense component 125-a may include voltage or current sense amplifiers to determine the stored logic state in memory cell 105-c. Upon determining the logic state, sense component 125-a may then store the output in latch 725, where it may be used in accordance with the operations of an electronic device using memory array 100-b. Based on the output of sense component 125-a, memory controller 140-b may determine if a write-back operation is needed.

Figure 8:
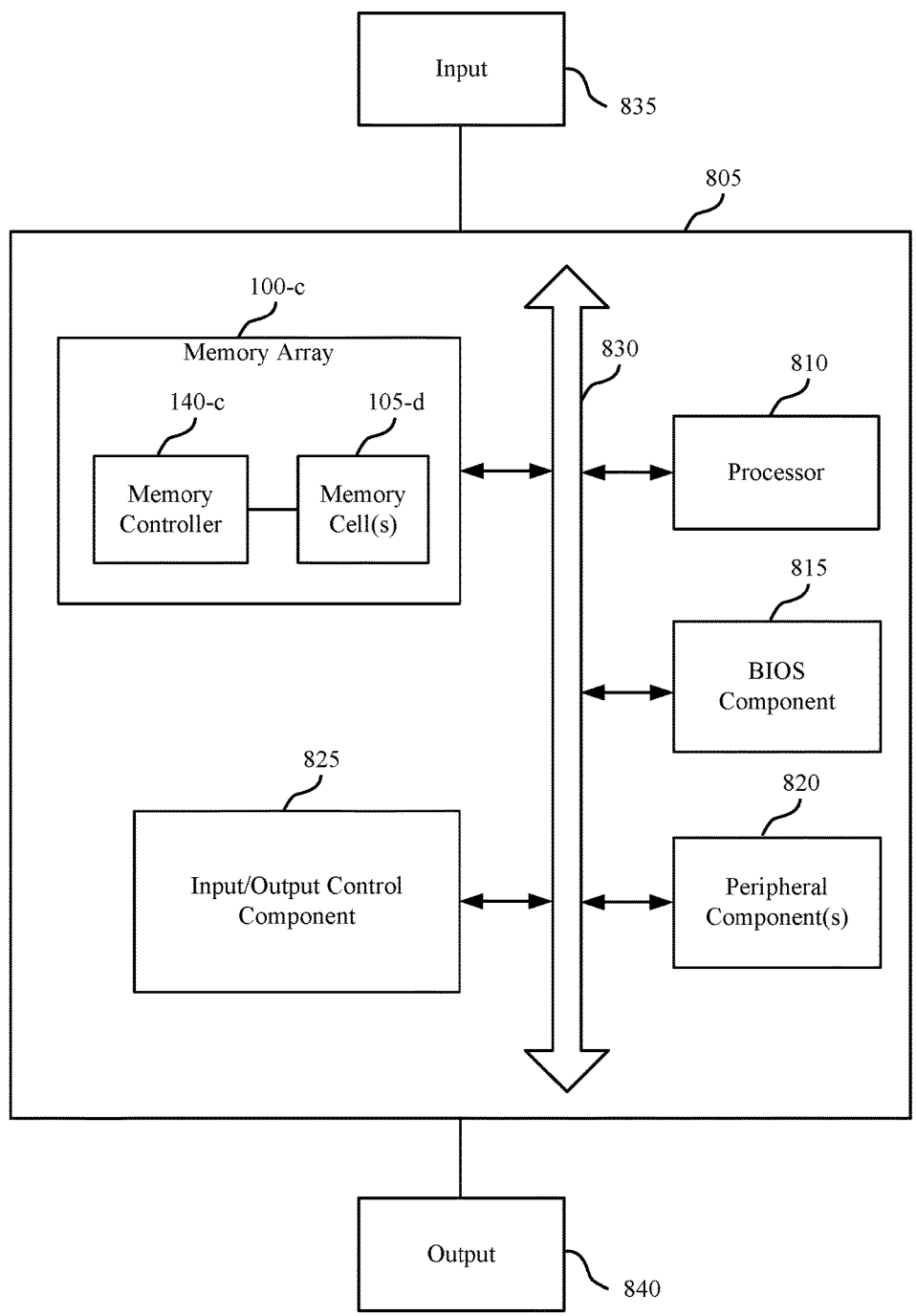
FIG. 8 illustrates a system, including a memory array, that supports discharging untargeted memory cells in accordance with various embodiments of the present disclosure.

FIG. 8 shows a diagram of a system 800 that supports discharging untargeted memory cells in accordance with various embodiments of the present disclosure. System 800 may include a device 805, which may be or include a printed circuit board to connect or physically support various components. Device 805 may include a memory array 100-c, which may be an example of memory array 100 described in FIGS. 1, 6, and 7. Memory array 100-c may contain memory controller 140-c and memory cell(s) 105-d, which may be examples of memory controller 140 described with reference to FIGS. 1, 6, and 7 and memory cells 105 described with reference to FIGS. 1, 2, 4, 5A-5D, 6, and 7. Device 805 may also include a processor 810, BIOS component 815, peripheral component(s) 820, and input/output control component 825. The components of device 805 may be in electronic communication with one another through bus 830.

Processor 810 may be configured to operate memory array 100-c through memory controller 140-c. In some cases, processor 810 performs the functions of memory controller 140 described with reference to FIGS. 1, 6, and 7. In other cases, memory controller 140-c may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including applying discharge voltages to one or more conductive lines following memory cell access operations. Processor 810 may, for example, be configured to execute computer-readable instructions stored in memory array 100-c to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 825 may manage data communication between processor 810 and peripheral component(s) 820, input devices 835, or output devices 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output control component 825.

Output 840 may represent a device or signal external to device 805 configured to receive output from device 805 or any of its components. Examples of output 840 may include data or signals sent to a display, audio speakers, a printing device, another processor or printed circuit board, etc. In some cases, output 840 may be a peripheral that interfaces with device 805 via peripheral component(s) 820 or may be managed by input/output control component 825.

The components of memory controller 140-*c*, device 805, and memory array 100-*c* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9A:
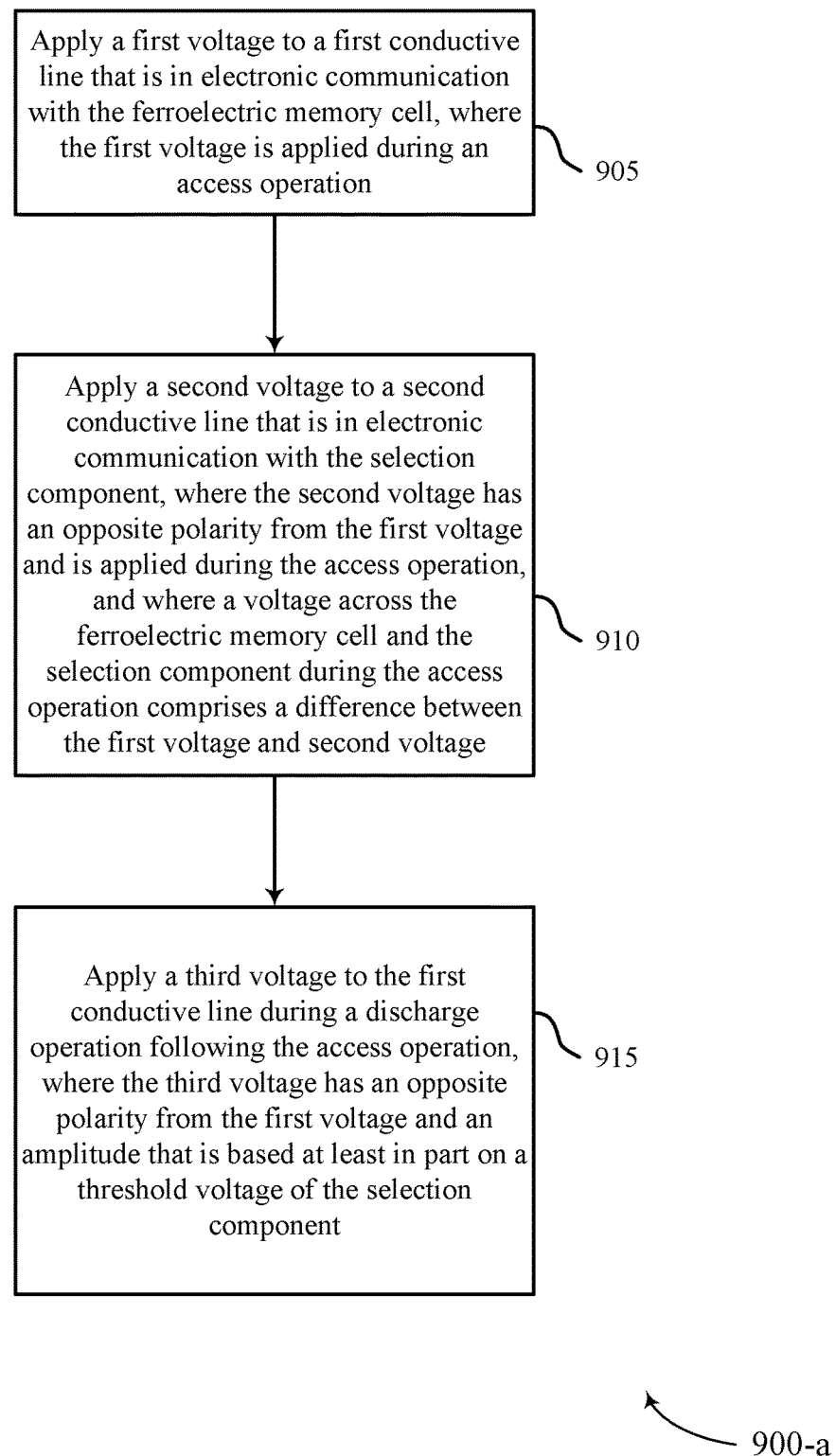
FIGS. 9A-12 are flowcharts that illustrate a method or methods for discharging untargeted memory cells in accordance with various embodiments of the present disclosure.

FIG. 9A shows a flowchart illustrating a method 900-*a* of discharging untargeted memory cells in accordance with various embodiments of the present disclosure. The operations of method 900-*a* may be implemented by a memory array 100 as described with reference to FIGS. 1-8. For example, the operations of method 900-*a* may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 905, the method may include applying a first voltage to a first conductive line that is in electronic communication with a ferroelectric memory cell, where the first voltage is applied during an access operation, as described with reference to FIGS. 1-6. In some cases, the ferroelectric memory cell may be in electronic communication with a selection component, which may be an electrically non-linear component. In certain examples, the operations of block 905 may be performed by the memory controller 140, as described with reference to FIGS. 1, 6, 7, and 8.

At block 910, the method may include applying a second voltage to a second conductive line that is in electronic communication with the selection component, where the second voltage has an opposite polarity from the first voltage and is applied during the access operation, and where a voltage across the ferroelectric memory cell and the selection component during the access operation comprises a difference between the first voltage and second voltage, as described with reference to FIGS. 1-6. The voltage across the ferroelectric memory cell and the selection component during the access operation may be greater than the threshold voltage of the selection component. In some examples, the second voltage is equal to an amplitude of the first voltage. In certain examples, the operations of block 910 may be performed by the memory controller 140, as described with reference to FIGS. 1, 6, 7, and 8.

At block 915, the method may include applying a third voltage to the first conductive line during a discharge operation following the access operation, where the third voltage has an opposite polarity from the first voltage and an amplitude that is based on a threshold voltage of the selection component, as described with reference to FIGS. 1-6. In some examples, a voltage across the ferroelectric memory cell and the selection component during the discharge operation comprises the third voltage and may be less than the threshold voltage of the selection component. In some examples, an amplitude of the third voltage is less than or equal to an amplitude of the first voltage. In some cases, the third voltage may be applied for a time period that is less than or equal to the applied time period of the first voltage. In some examples, the second voltage is equal to an amplitude of the first voltage. In some cases, the first voltage, the second voltage, and the third voltage are applied with respect to a virtual ground, which is used as the inhibit voltage to prevent ferroelectric memory cells of the memory array from discharging. In certain examples, the operations of block 915 may be performed by the memory controller 140, as described with reference to FIGS. 1, 6, 7, and 8.

The method may also include applying a fourth voltage to the second conductive line during the discharge operation, where the fourth voltage has a polarity opposite to the second voltage and an amplitude based on the threshold voltage of the selection component. In some cases, the fourth voltage may be applied after the third voltage. In other cases, the fourth voltage may be applied simultaneously with the third voltage, where a voltage across the ferroelectric memory cell and the selection component during the discharge operation is the difference between the third voltage and the fourth voltage. In some examples, an amplitude of the fourth voltage may be less than or equal to an amplitude of the second voltage. The amplitude of the fourth voltage may be equal to an amplitude of the third voltage in some instances.

Figure 9B:
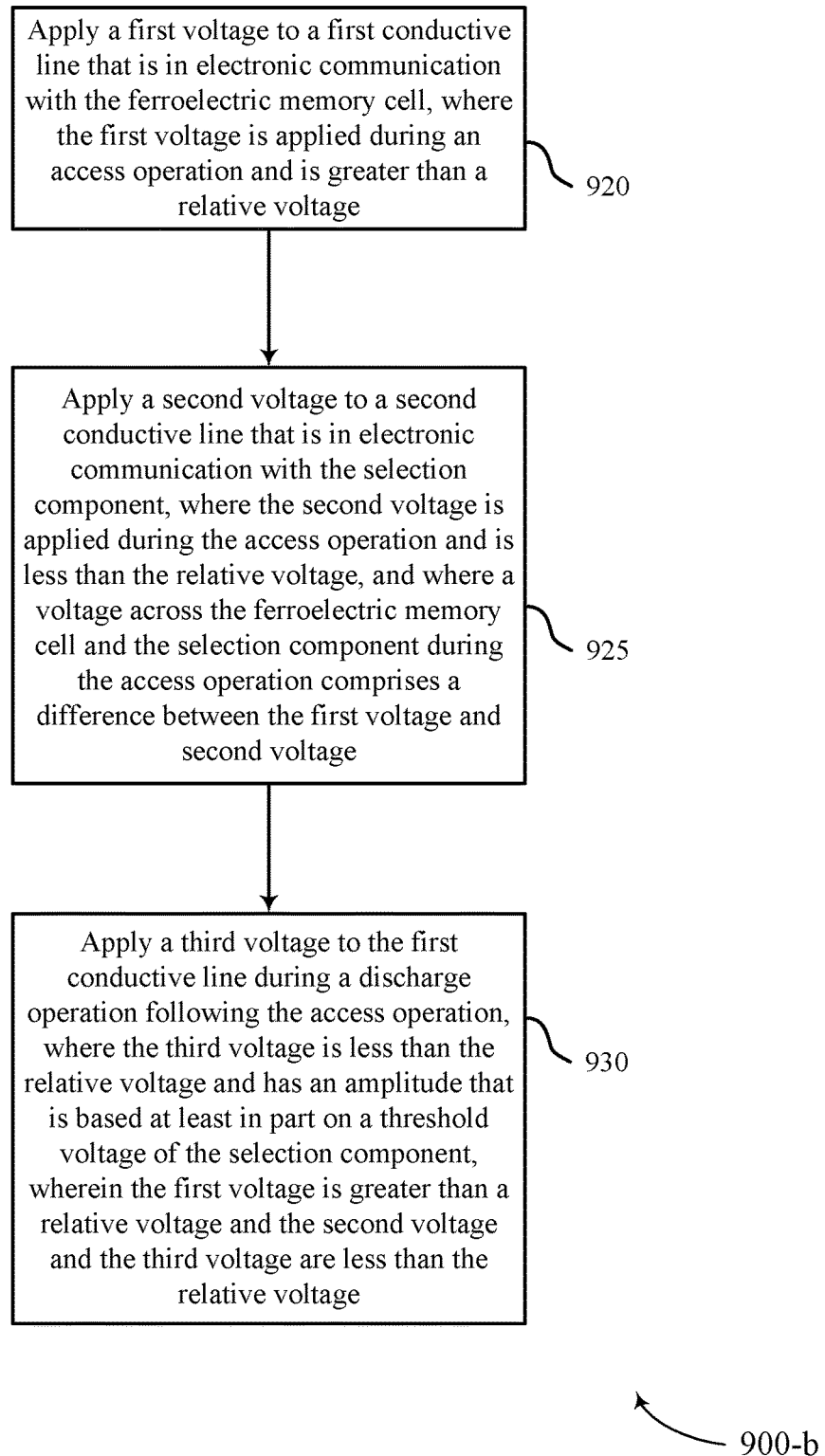

FIG. 9B shows a flowchart illustrating a method 900-*b* of discharging untargeted memory cells in accordance with various embodiments of the present disclosure. The operations of method 900-*a* may be implemented by a memory array 100 as described with reference to FIGS. 1-8. For example, the operations of method 900-*b* may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 920, the method may include applying a first voltage to a first conductive line that is in electronic communication with a ferroelectric memory cell, where the first voltage is applied during an access operation and is greater than a relative voltage, as described with reference to FIGS. 1-6. In some cases, the ferroelectric memory cell may be in electronic communication with a selection component, which may be an electrically non-linear component. In certain examples, the operations of block 920 may be performed by the memory controller 140, as described with reference to FIGS. 1, 6, 7, and 8.

At block 925, the method may include applying a second voltage to a second conductive line that is in electronic communication with the selection component, where the second voltage is applied during the access operation and is less than the relative voltage, and where a voltage across the ferroelectric memory cell and the selection component during the access operation comprises a difference between the first voltage and second voltage, as described with reference to FIGS. 1-6. The voltage across the ferroelectric memory cell and the selection component during the access operation may be greater than the threshold voltage of the selection component. In some examples, the second voltage is equal to an amplitude of the first voltage. In certain examples, the operations of block 925 may be performed by the memory controller 140, as described with reference to FIGS. 1, 6, 7, and 8.

At block 930, the method may include applying a third voltage to the first conductive line during a discharge operation following the access operation, where the third voltage is less than the third voltage and has an amplitude that is based on a threshold voltage of the selection component, as described with reference to FIGS. 1-6. In some examples, a voltage across the ferroelectric memory cell and the selection component during the discharge operation comprises the third voltage and may be less than the threshold voltage of the selection component. In some examples, an amplitude of the third voltage is less than or equal to an amplitude of the first voltage. In some cases, the third voltage may be applied for a time period that is less than or equal to the applied time period of the first voltage. In some cases, the relative voltage is a mid-bias voltage and is used as the inhibit voltage for preventing ferroelectric memory cells of the memory array from discharging. In certain examples, the operations of block 930 may be performed by the memory controller 140, as described with reference to FIGS. 1, 6, 7, and 8.

The method may also include applying a fourth voltage to the second conductive line during the discharge operation, where the fourth voltage has a polarity opposite to the second voltage and an amplitude based on the threshold voltage of the selection component. In some cases, the fourth voltage may be applied after the third voltage. In other cases, the fourth voltage may be applied simultaneously with the third voltage, where a voltage across the ferroelectric memory cell and the selection component during the discharge operation is the difference between the third voltage and the fourth voltage. In some examples, an amplitude of the fourth voltage may be less than or equal to an amplitude of the second voltage. The amplitude of the fourth voltage may be equal to an amplitude of the third voltage in some instances.

Figure 10:
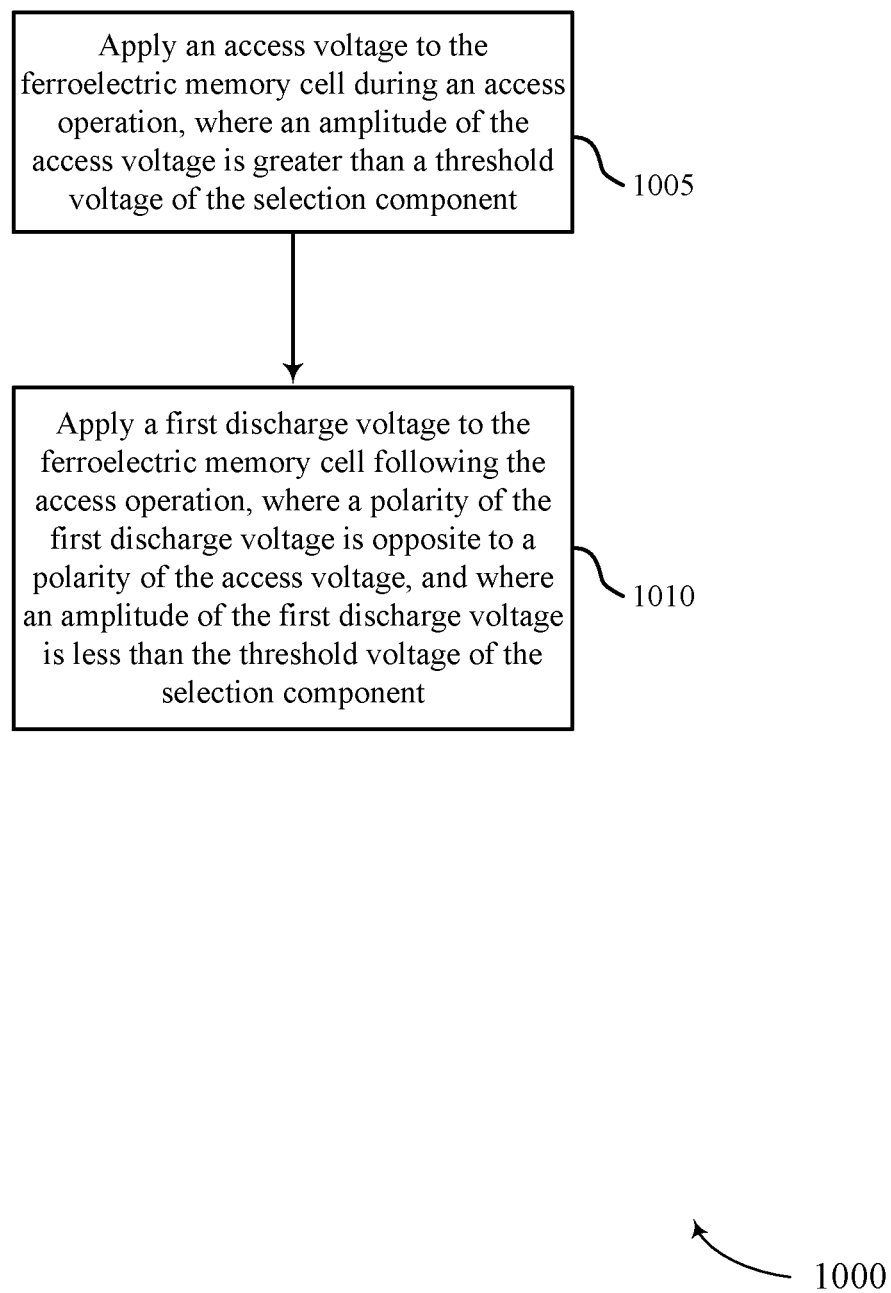

FIG. 10 shows a flowchart illustrating a method 1000 of discharging untargeted memory cells in accordance with various embodiments of the present disclosure. The operations of method 1000 may be implemented by a memory array 100 as described with reference to FIGS. 1-8. For example, the operations of method 1000 may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware.

At block 1005, the method may include applying an access voltage to a ferroelectric memory cell during an access operation, where an amplitude of the access voltage is greater than a threshold voltage of a selection component in electronic communication with the memory cell, as described with reference to FIGS. 1-6. The access operation may include reading the ferroelectric memory cell or writing the ferroelectric memory cell. In some cases, the selection component may be a metal-semiconductor switch, a metal-semiconductor-metal switch, or a chalcogenide material. In certain examples, the operations of block 1005 may be performed by the memory controller 140, as described with reference to FIGS. 1, 6, 7, and 8.

At block 1010, the method may include applying a first discharge voltage to the ferroelectric memory cell following the access operation, where a polarity of the first discharge voltage is opposite to a polarity of the access voltage, and where an amplitude of the first discharge voltage is less than the threshold voltage of the selection component, as described with reference to FIGS. 1-6. In some cases, the first discharge voltage may be less than the amplitude of the access voltage. For example, the amplitude of the first discharge voltage may be less than or equal to one-half of the amplitude of the access voltage. In certain examples, the operations of block 1010 may be performed by the memory controller 140, as described with reference to FIGS. 1, 6, 7, and 8.

The method may include applying a second discharge voltage to the ferroelectric memory cell following the first discharge voltage, where a polarity of the second discharge voltage is opposite to the polarity of the access voltage, and where an amplitude of the second discharge voltage is less than the threshold voltage of the selection component.

Figure 11:
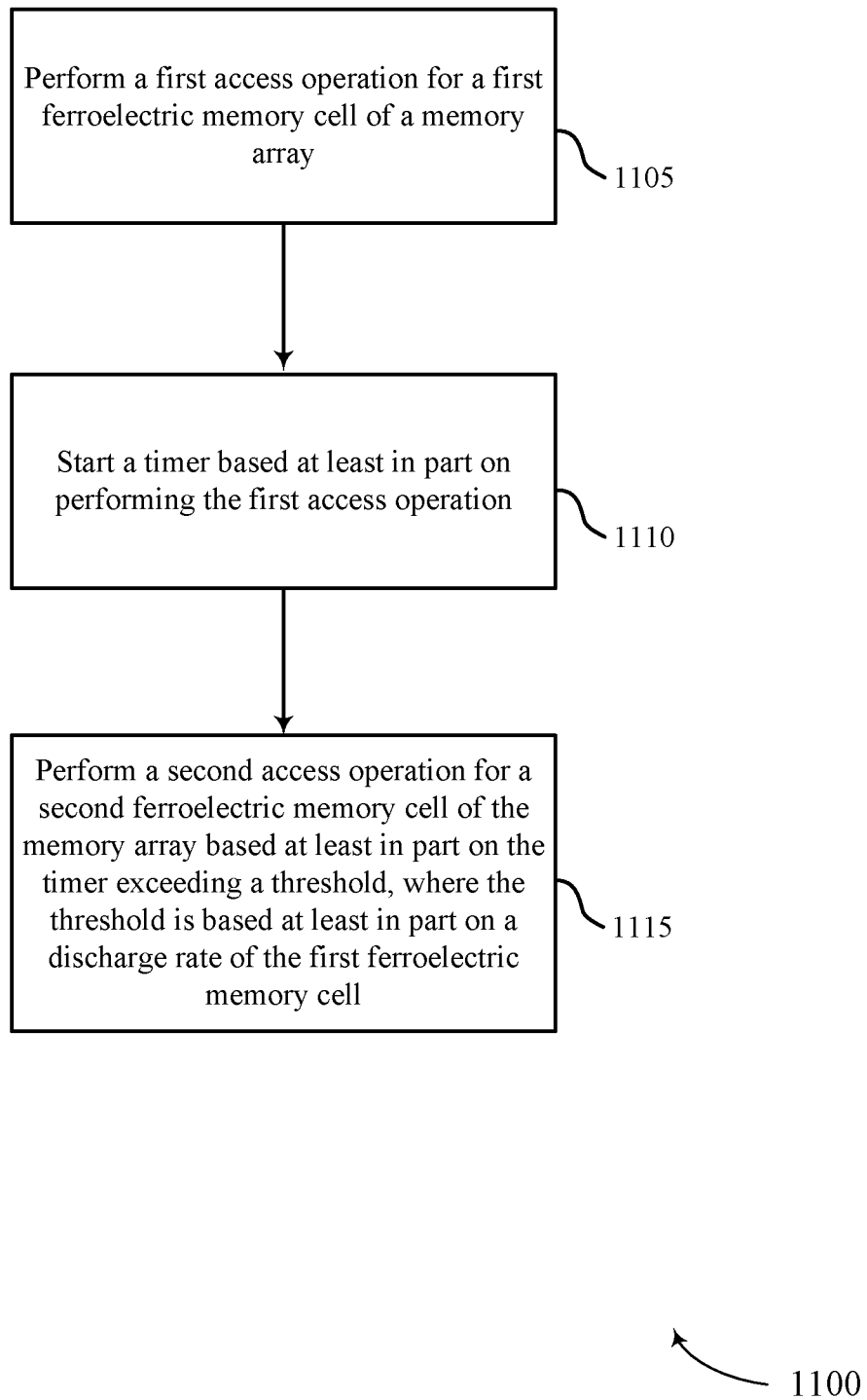

FIG. 11 shows a flowchart illustrating a method 1100 of discharging untargeted memory cells in accordance with various embodiments of the present disclosure. The operations of method 1100 may be implemented by a memory array 100 as described with reference to FIGS. 1-8. For example, the operations of method 1100 may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware. In some examples of the method, the memory array may be a memory bank.

At block 1105, the method may include performing a first access operation for a first ferroelectric memory cell of a memory array, as described with reference to FIGS. 1-6. In certain examples, the operations of block 1105 may be performed by the memory controller 140, as described with reference to FIGS. 1, 6, 7, and 8.

At block 1110, the method may include starting a timer based at least in part on performing the first access operation, as described with reference to FIGS. 6 and 7. In certain examples, the operations of block 1110 may be performed by the memory controller 140, as described with reference to FIGS. 1, 6, 7, and 8, or timer 610 as described with reference to FIG. 6.

At block 1115, the method may include performing a second access operation for a second ferroelectric memory cell of the memory array based at least in part on the timer exceeding a threshold, where the threshold is based at least in part on a discharge rate of the first ferroelectric memory cell, as described with reference to FIGS. 4 and 6. In certain examples, the operations of block 1115 may be performed by the memory controller 140, as described with reference to FIGS. 1, 6, 7, and 8.

The method may further include resetting the timer based at least in part on performing the second access operation. In some cases, the first ferroelectric memory cell is in electronic communication with the second ferroelectric memory cell of the memory array, where a charge of the second ferroelectric memory cell may be based on the first access operation for the first ferroelectric memory cell, and the threshold may be based on a time to discharge the second ferroelectric memory cell. In some examples, the method may include accessing a third ferroelectric memory cell before the timer exceeds the threshold, where the third ferroelectric memory cell is isolated from (e.g., not in electronic communication with) the first ferroelectric memory cell.

In some examples, the timer may be a count-up timer. In other examples, the timer may be a count-down timer, and the second access operation may be performed based on an expiration of the timer.

Figure 12:
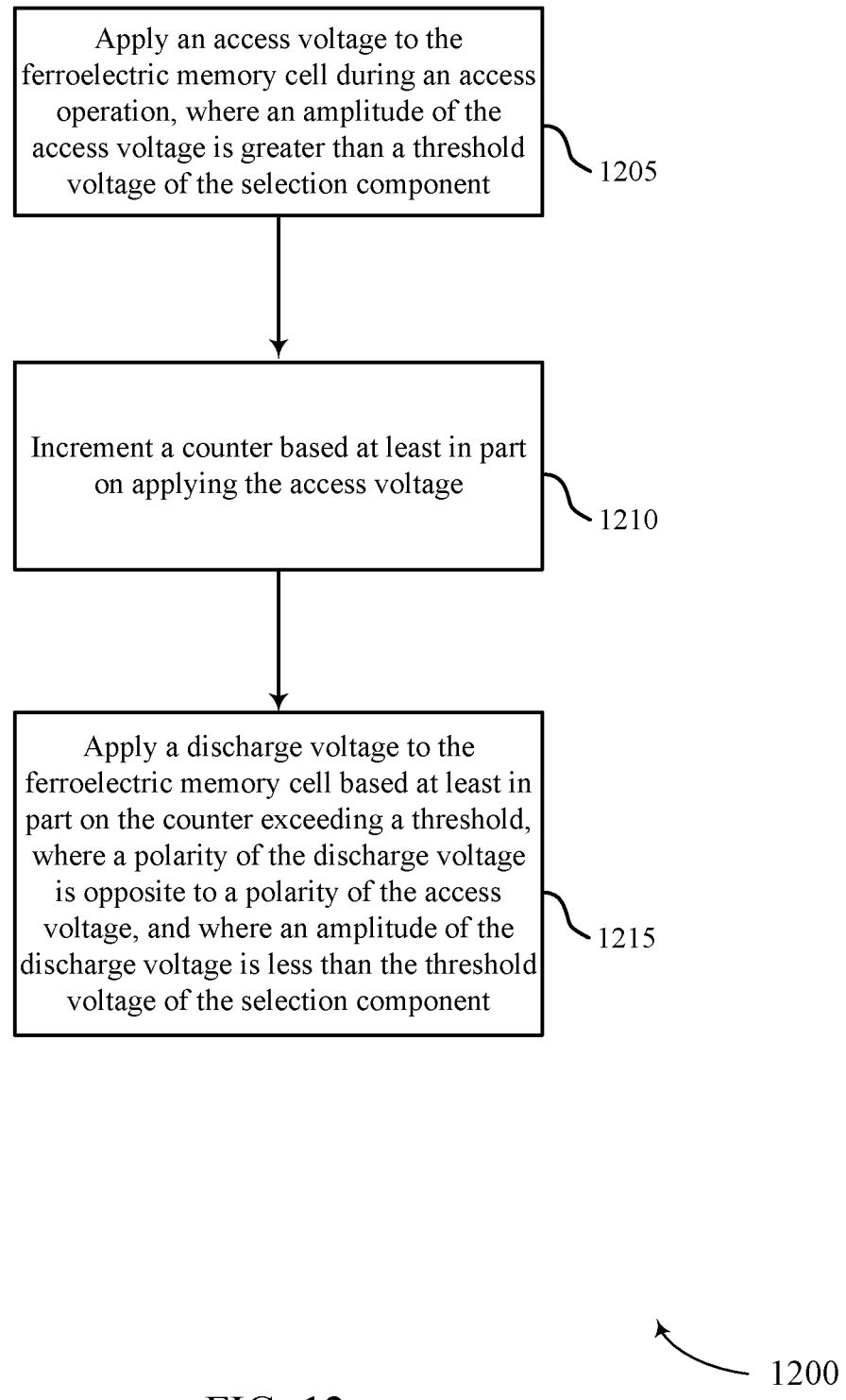

FIG. 12 shows a flowchart illustrating a method 1200 of discharging untargeted memory cells in accordance with various embodiments of the present disclosure. The operations of method 1200 may be implemented by a memory array 100 as described with reference to FIGS. 1-8. For example, the operations of method 1200 may be performed by a memory controller 140 as described with reference to FIGS. 1, 6, 7, and 8. In some examples, a memory controller 140 may execute a set of codes to control the functional elements of the memory array 100 to perform the functions described below. Additionally or alternatively, the memory controller 140 may perform the functions described below using special-purpose hardware. The memory array may, in some cases, be a memory bank. In some examples, a ferroelectric memory cell may be in electronic communication with a selection component.

At block 1205, the method may include applying an access voltage to the ferroelectric memory cell during an access operation, where an amplitude of the access voltage is greater than a threshold voltage of the selection component, as described with reference to FIGS. 1-6. In certain examples, the operations of block 1205 may be performed by the memory controller 140, as described with reference to FIGS. 1, 6, 7, and 8.

At block 1210, the method may include incrementing a counter based at least in part on applying the access voltage, as described with reference to FIG. 6. In certain examples, the operations of block 1210 may be performed by the memory controller 140, as described with reference to FIGS. 1, 6, 7, and 8, or the counter 605 with reference to FIGS. 6 and 7.

At block 1215, the method may include applying a discharge voltage to the ferroelectric memory cell based at least in part on the counter exceeding a threshold, where a polarity of the discharge voltage is opposite to a polarity of the access voltage, and where an amplitude of the discharge voltage is less than the threshold voltage of the selection component, as described with reference to FIGS. 1-6. In some examples, the threshold comprises a rate of access attempts of the ferroelectric memory cell. In certain examples, the operations of block 1215 may be performed by the memory controller 140, as described with reference to FIGS. 1, 6, 7, and 8.

In some examples, the memory array includes a plurality of memory cells, the plurality of memory cells comprising the ferroelectric memory cell, where applying the discharge voltage to the ferroelectric memory cell may include applying the discharge voltage to the plurality of memory cells of the memory array. In some cases, the discharge voltage may be applied to a subset of the plurality of memory cells of the memory array.

In some examples, the ferroelectric memory cell and the selection component may be in electronic communication with a first conductive line and a second conductive line, where applying the access voltage to the ferroelectric memory cell comprises applying a first voltage to the first conductive line and applying a second voltage to the second conductive line, where the access voltage comprises a voltage difference between the first voltage and the second voltage. Applying the discharge voltage to the ferroelectric memory cell may include applying a third voltage to the first conductive line, where the third voltage has an opposite polarity from the first voltage, and a voltage across the ferroelectric memory cell and the selection component is the third voltage.

In some cases, applying the discharge voltage to the ferroelectric memory cell comprises applying a fourth voltage to the second conductive line after the third voltage is applied to the first conductive line, where the fourth voltage has an opposite polarity from the second voltage, and a voltage across the ferroelectric memory cell and the selection component is the fourth voltage. In other cases, applying the discharge voltage to the ferroelectric memory cell comprises applying a fourth voltage to the second conductive line simultaneously with the third voltage, where the fourth voltage has an opposite polarity from the second voltage, and a voltage across the ferroelectric memory cell and the selection component is a difference between the fourth voltage and the third voltage.

Thus, methods 900, 1000, 1100, and 1200 may provide for discharging untargeted memory cells to prevent corruption of their logic values during access operations of targeted memory cells. Methods 900-1200 may thus be methods of operating a memory array that comprises a ferroelectric memory cell in electronic communication with a selection component or may be methods of operating a plurality of ferroelectric memory cells. It should be noted that methods 900, 1000, 1100, and 1200 describe possible implementations, and the operations and steps may be rearranged or otherwise modified such that other implementations are possible. In some examples, aspects from two or more of the methods 900, 1000, 1100, and 1200 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon (Si), germanium, silicon-germanium alloy, gallium arsenide (GaAs), gallium nitride (GaN), etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. A portion or cut of a substrate containing a memory array or circuit may be referred to as a die.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
    applying a first voltage to a first conductive line that is in electronic communication with a ferroelectric memory cell that is in electronic communication with a selection component, wherein the first voltage is applied during an access operation;
    applying a second voltage to a second conductive line that is in electronic communication with the selection component, wherein the second voltage is applied during the access operation, and wherein a voltage across the ferroelectric memory cell and the selection component during the access operation comprises a difference between the first voltage and the second voltage; and
    applying a third voltage to the first conductive line during a discharge operation following the access operation, wherein the third voltage has an amplitude that is based at least in part on a threshold voltage of the selection component.

2. The method of claim 1, wherein the second voltage and the third voltage have an opposite polarity from the first voltage.

3. The method of claim 2, further comprising:
    applying a fourth voltage to the second conductive line during the discharge operation, wherein the fourth voltage has an opposite polarity from the second voltage and an amplitude that is based at least in part on the threshold voltage of the selection component.

4. The method of claim 3, wherein applying the fourth voltage comprises:
    applying the fourth voltage after applying the third voltage.

5. The method of claim 3, wherein applying the fourth voltage comprises:
    applying the fourth voltage simultaneously with the third voltage, wherein a voltage across the ferroelectric memory cell and the selection component during the discharge operation comprises a difference between the third voltage and the fourth voltage.

6. The method of claim 3, wherein the amplitude of the fourth voltage is less than or equal to an amplitude of the second voltage.

7. The method of claim 3, wherein the amplitude of the fourth voltage is equal to the amplitude of the third voltage.

8. The method of claim 1, wherein the first voltage is greater than a relative voltage and the second voltage and the third voltage are less than the relative voltage.

9. The method of claim 1, wherein a voltage across the ferroelectric memory cell and the selection component during the discharge operation comprises the third voltage.

10. The method of claim 1, wherein the selection component comprises an electrically non-linear component.

11. The method of claim 1, wherein the voltage across the ferroelectric memory cell and the selection component during the access operation is greater than the threshold voltage of the selection component.

12. The method of claim 1, wherein a voltage across the ferroelectric memory cell and the selection component during the discharge operation is less than the threshold voltage of the selection component.

13. The method of claim 1, wherein an amplitude of the first voltage is equal to an amplitude of the second voltage.

14. The method of claim 1, wherein the first voltage is applied for a first time period and the third voltage is applied for a second time period that is less than or equal to the first time period.

15. A method, comprising:
    applying an access voltage to a ferroelectric memory cell that is in electronic communication with a selection component during an access operation, wherein an amplitude of the access voltage is greater than a threshold voltage of the selection component; and
    applying a first discharge voltage to the ferroelectric memory cell following the access operation, wherein a polarity of the first discharge voltage is opposite to a polarity of the access voltage, and wherein an amplitude of the first discharge voltage is less than the threshold voltage of the selection component.

16. The method of claim 15, further comprising:
    applying a second discharge voltage to the ferroelectric memory cell following the first discharge voltage, wherein a polarity of the second discharge voltage is opposite to the polarity of the access voltage, and wherein an amplitude of the second discharge voltage is less than the threshold voltage of the selection component.

17. The method of claim 15, wherein the amplitude of the first discharge voltage is less than or equal to one-half of the amplitude of the access voltage.

18. The method of claim 15, wherein the selection component comprises a metal-semiconductor switch, a metal-semiconductor-metal switch, or a chalcogenide material.

19. A method, comprising:
    performing a first access operation for a first ferroelectric memory cell of a memory array comprising a plurality of ferroelectric memory cells;
    starting a timer based at least in part on performing the first access operation; and
    performing a second access operation for a second ferroelectric memory cell of the memory array based at least in part on the timer exceeding a threshold,
    wherein the threshold is based at least in part on a discharge rate of the first ferroelectric memory cell.

20. The method of claim 19, further comprising:
    resetting the timer based at least in part on performing the second access operation.

21. The method of claim 19, wherein:
    the first ferroelectric memory cell is in electronic communication with the second ferroelectric memory cell of the memory array;
    a charge of the second ferroelectric memory cell is based at least in part on the first access operation for the first ferroelectric memory cell; and
    the threshold is based at least in part on a time to discharge the second ferroelectric memory cell.

22. The method of claim 19, further comprising:
accessing a third ferroelectric memory cell before the timer exceeds the threshold, wherein the third ferroelectric memory cell is isolated from the first ferroelectric memory cell.

23. The method of claim 19, wherein the timer comprises a count-down timer, and wherein performing the second access operation comprises:
performing the second access operation based at least in part on an expiration of the timer.

24. A method, comprising:
applying during an access operation an access voltage to a ferroelectric memory cell that is in electronic communication with a selection component, wherein an amplitude of the access voltage is greater than a threshold voltage of the selection component;
incrementing a counter based at least in part on applying the access voltage; and
applying a discharge voltage to the ferroelectric memory cell based at least in part on the counter exceeding a threshold, wherein a polarity of the discharge voltage is opposite to a polarity of the access voltage, and wherein an amplitude of the discharge voltage is less than the threshold voltage of the selection component.

25. The method of claim 24, wherein a memory array comprises a plurality of memory cells, the plurality of memory cells comprising the ferroelectric memory cell, and wherein applying the discharge voltage to the ferroelectric memory cell comprises:
applying the discharge voltage to the plurality of memory cells of the memory array.

26. The method of claim 24, wherein the threshold is based at least in part on a rate of access attempts of the ferroelectric memory cell.

27. The method of claim 24, wherein the ferroelectric memory cell and the selection component are in electronic communication with a first conductive line and a second conductive line, and wherein applying the access voltage to the ferroelectric memory cell comprises:
applying a first voltage to the first conductive line and applying a second voltage to the second conductive line, wherein the access voltage comprises a voltage difference between the first voltage and the second voltage.

28. The method of claim 27, wherein applying the discharge voltage to the ferroelectric memory cell comprises:
applying a third voltage to the first conductive line, wherein the third voltage has an opposite polarity from the first voltage, and wherein a voltage across the ferroelectric memory cell and the selection component comprises the third voltage.

29. The method of claim 28, wherein applying the discharge voltage to the ferroelectric memory cell comprises:
applying a fourth voltage to the second conductive line after the third voltage is applied to the first conductive line, wherein the fourth voltage has an opposite polarity from the second voltage, and wherein a voltage across the ferroelectric memory cell and the selection component comprises the fourth voltage.

30. The method of claim 28, wherein the second voltage and the third voltage have an opposite polarity from the first voltage, and wherein applying the discharge voltage to the ferroelectric memory cell comprises:
applying a fourth voltage to the second conductive line simultaneously with the third voltage, wherein the fourth voltage has an opposite polarity from the second voltage, and wherein a voltage across the ferroelectric memory cell and the selection component comprises a difference between the fourth voltage and the third voltage.

31. An apparatus, comprising:
a ferroelectric memory cell and a selection component in electronic communication with and positioned between a first conductive line and a second conductive line; and
a controller in electronic communication with the first conductive line and the second conductive line, wherein the controller is operable to:
apply a first voltage to the first conductive line during an access operation;
apply a second voltage to the second conductive line during the access operation, wherein a voltage across the ferroelectric memory cell and the selection component during the access operation comprises a difference between the first voltage and the second voltage; and
apply a third voltage to the first conductive line during a discharge operation following the access operation, wherein the third voltage has an amplitude that is based at least in part on a threshold voltage of the selection component.

32. The apparatus of claim 31, wherein the controller is operable to:
apply a fourth voltage to the second conductive line during the discharge operation, wherein the fourth voltage has an opposite polarity from the second voltage and has an amplitude based at least in part on the threshold voltage of the selection component.

33. The apparatus of claim 31, further comprising:
a pillar in contact with the first conductive line and the second conductive line, wherein the pillar comprises a first electrode, the selection component, and the ferroelectric memory cell, wherein the ferroelectric memory cell comprises a second electrode, a ferroelectric memory element, and a third electrode.

34. The apparatus of claim 31, further comprising:
a counter, wherein the controller is operable to:
increment the counter based at least in part on applying the first voltage or the second voltage during the access operation.

35. The apparatus of claim 31, further comprising:
a voltage regulator, wherein the amplitude of the third voltage is based at least in part on an output of the voltage regulator, and wherein the controller is operable to:
apply the third voltage to the first conductive line during the discharge operation, wherein the amplitude of the third voltage is less than an amplitude of the first voltage.

* * * * *